United States Patent [19]
Iwaya et al.

[11] Patent Number: 6,064,112
[45] Date of Patent: May 16, 2000

[54] RESIN-MOLDED SEMICONDUCTOR DEVICE HAVING A LEAD ON CHIP STRUCTURE

[75] Inventors: Akihiko Iwaya, Tokyo; Tamaki Wada, Higashimurayama; Masachika Masuda, Tokorozawa; Kunihiro Tsubosaki, Hino; Asao Nishimura, Kokubunji, all of Japan

[73] Assignee: Hitachi, Ltd., Tokyo, Japan

[21] Appl. No.: 09/047,350

[22] Filed: Mar. 25, 1998

[30] Foreign Application Priority Data

Mar. 25, 1997 [JP] Japan ..................................... 9-072349

[51] Int. Cl.[7] .......................... H01L 25/10; H01L 25/11; H01L 25/18; H01L 23/48
[52] U.S. Cl. .......................... 257/673; 257/692; 257/676; 257/646; 257/691
[58] Field of Search .................................. 257/692, 673, 257/676, 666, 693, 690, 691

[56] References Cited

U.S. PATENT DOCUMENTS

| | | |
|---|---|---|
| 4,951,120 | 8/1990 | Hagiwara et al. . |
| 5,065,224 | 11/1991 | Fraser et al. .............................. 257/676 |
| 5,334,803 | 8/1994 | Yamamura et al. ..................... 257/676 |
| 5,381,036 | 1/1995 | Bigler et al. ............................. 257/676 |
| 5,442,233 | 8/1995 | Anjoh et al. ............................. 257/666 |
| 5,451,813 | 9/1995 | Kazutaka ................................. 257/676 |
| 5,455,200 | 10/1995 | Bigler et al. ............................. 257/676 |
| 5,559,366 | 9/1996 | Fogal et al. .............................. 257/666 |
| 5,572,066 | 11/1996 | Safai et al. ............................... 257/666 |
| 5,585,665 | 12/1996 | Anjoh et al. ............................. 257/666 |
| 5,621,242 | 4/1997 | Mok et al. ............................... 257/666 |
| 5,684,328 | 11/1997 | Jin et al. .................................. 257/676 |
| 5,744,827 | 4/1998 | Jeong et al. ............................. 257/686 |
| 5,760,471 | 6/1998 | Fujisawa et al. ........................ 257/692 |
| 5,763,945 | 6/1998 | Corisis et al. ........................... 257/666 |
| 5,792,676 | 8/1998 | Masumoto et al. ..................... 257/676 |
| 5,821,605 | 10/1998 | Hong et al. .............................. 257/666 |
| 5,874,783 | 2/1999 | Yamada ................................... 257/778 |
| 5,917,242 | 6/1999 | Ball ......................................... 257/737 |
| 5,969,413 | 10/1999 | Yano et al. .............................. 257/673 |
| 5,998,877 | 12/1999 | Ohuichi ................................... 257/787 |
| 5,999,413 | 12/1999 | Ohuchi et al. .......................... 257/738 |
| 6,002,167 | 12/1999 | Hatano et al. .......................... 257/696 |

FOREIGN PATENT DOCUMENTS

| | | |
|---|---|---|
| 0114531A1 | 12/1983 | European Pat. Off. . |
| 0594299A2 | 9/1993 | European Pat. Off. . |
| 0680086A2 | 4/1995 | European Pat. Off. . |
| 61-218139 | 9/1986 | Japan . |
| 61-236130 | 10/1986 | Japan . |
| 5-175406 | 7/1993 | Japan . |
| 6-85150 | 3/1994 | Japan . |

*Primary Examiner*—Alexander Oscar Williams
*Attorney, Agent, or Firm*—Antonelli, Terry, Stout & Kraus, LLP

[57] ABSTRACT

A semiconductor device in which inner leads among a plurality of leads are arranged on a circuit formation face of a semiconductor chip encapsulated by a resin encapsulating body and bonding pads formed on the circuit formation face of the chip and the inner leads are electrically connected. An adhesive is selectively applied only to the inner leads on the outermost sides arranged on both ends of the chip among the plurality of inner leads. The circuit formation face of the chip and the inner leads of the selected leads are joined with the adhesive Each of the selected leads has a step on the main face of the semiconductor chip and the leads except for the selected leads have almost straight shapes without being processed to have steps.

13 Claims, 24 Drawing Sheets

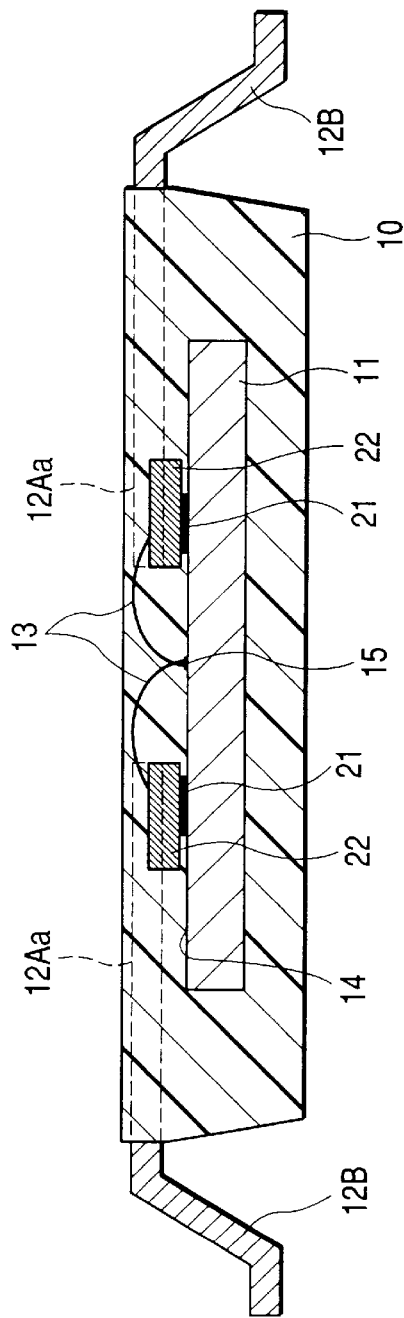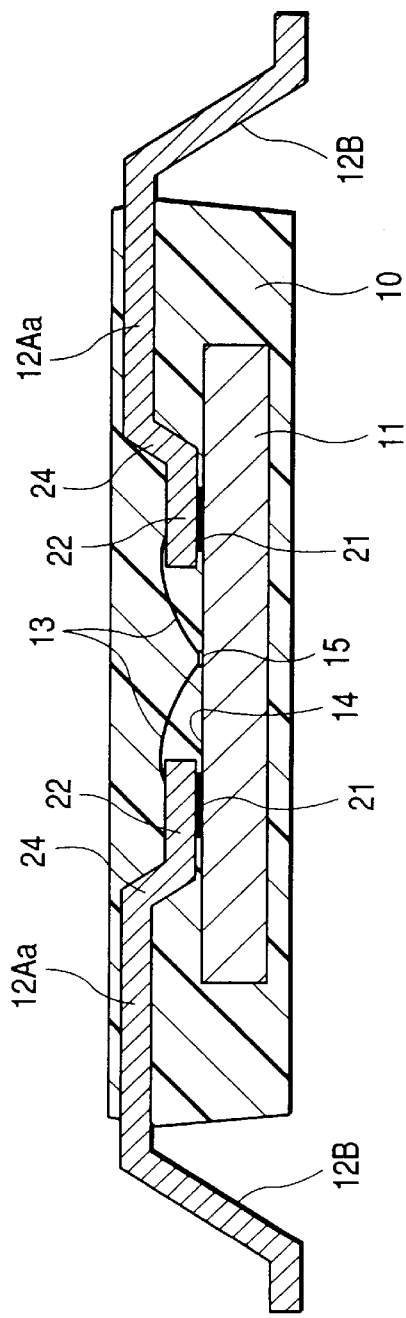

RESIN-MOLDED SEMICONDUCTOR DEVICE HAVING A LEAD ON CHIP STRUCTURE

BACKGROUND OF THE INVENTION

The present invention relates to a technique which is effective when applied to a semiconductor device having a structure in which inner leads among the device leads are arranged on a circuit formation face of a semiconductor chip encapsulated in a package body.

There is a package having an LOC (Lead On Chip) structure representing one of the surface mount type LSI packages. The package has a structure such that the inner leads among the device leads are arranged via a tape-shaped insulating film on the main surface of a semiconductor chip, that is, on a circuit formation face on which a plurality of semiconductor devices and bonding pads are formed, and the inner leads and the bonding pads on the semiconductor chip are electrically connected by Au wires. The insulating film has a laminated structure obtained by coating an adhesive on both faces of a base film made of a heat-resisting resin such as polyimide. A package having a LOC structure of this kind is described in, for example, Japanese Patent Application Laid-Open Nos. 61-218139, 61-236130, and the like.

On the other hand, since engineering workstations and personal computers of recent years require a memory (RAM) of large capacity in order to process a large amount of data at high speed, a technique for laminating a memory module is being examined.

As a specific example, there is a known laminated-type memory module in which a plurality of thin LSI packages, such as TSOPs (Thin Small Outline Packages) and TSOJs (Thin Small Outline J-lead Packages), are piled up, and outer leads of the upper and lower packages are connected by soldering or the like and are fixed on a printed wiring board. For example, a technique is described in Japanese Patent Application Laid-Open No. 5-175406 whereby outer leads of TSOJs are bent upward in the middle and a part of each of the outer leads is extended in the horizontal direction, thereby overlapping the leads of the upper and lower packages.

SUMMARY OF THE INVENTION

In the conventional package having an LOC structure, an insulating film having a thickness of about 50 $\mu$m is interposed between a semiconductor chip and the inner leads, and this is one of the causes which prevent the thickness of the package from being reduced. Further, in the case of manufacturing a laminated type memory module by using the conventional LOC structured package, the thickness of the package also prevents reduction in the thickness of the module.

The inventors have examined a technique for joining the inner leads and the semiconductor chip with an adhesive without using an interposed insulating film. The following is not a known technique, but is a technique examined by the inventors. The outline of the technique is as follows.

That is, when it is considered that the inner leads are joined to the circuit formation face of the semiconductor chip with an adhesive, if an insulating tape is adhered to a lead frame or the semiconductor chip, only one joining process is necessary. On the other hand, in case of applying the adhesive to the inner lead parts, the adhesive has to be applied to each of the plurality of inner leads from a dispenser, so that the application of adhesive takes time. Since the workability is not preferable, this becomes a problem from the point of view of improvement in manufacturing efficiency of the semiconductor device having an LOC structure. Consequently, the possibility has been considered that the adhesive need not be applied to all of the inner leads, but may be applied to some selected inner leads. In this case, however, since the joined area of the semiconductor chip and the lead frame is reduced as a whole, the semiconductor chip tends to be deviated from the lead frame upon formation of the package body by resin encapsulation. A joining method which can maintain the strength of joining the semiconductor chip to the lead frame at the time of the resin encapsulation without applying an adhesive to all of the inner leads has been examined.

In case of joining the inner leads to the circuit formation face of the semiconductor chip by using an adhesive, it is estimated that factors caused by temperature cycling or thermal cycling among the adhesive, the inner leads, and the semiconductor chip have to be considered to a greater extent than in a case of joining the inner leads to the circuit formation face by using an insulating tape. In the case of using an insulating tape, since all of the inner leads are joined by the integral continuous insulating tape, thermal distortion caused by a difference in thermal expansion and contraction values of the inner leads, the semiconductor chip, and the insulating tape due to temperature cycling can be absorbed by the integral continuous insulating tape. By contrast, in case of joining the inner leads to the semiconductor chip by using an adhesive having a coefficient of thermal expansion which is close to that of the insulating tape, the adhesive is applied in spots to the respective inner leads and the applied adhesive is separated and independent. It can be considered in this case, however, that the thermal distortion cannot be absorbed by the adhesive to the same extent that the insulating tape does. When the thermal distortion cannot be absorbed, stress is concentrated on the joining parts and a problem occurs in which the parts are disconnected, so that the durability of the semiconductor device cannot be improved.

On the main face, that is, on the circuit formation face of the semiconductor chip, after forming a semiconductor integrated circuit on a silicon wafer, a surface protective layer made of a resin is applied and formed in order to protect the circuit from radiation, such as from alpha-rays emitted to the circuit. In other words, the circuit formation face is covered by the surface protective layer made of a resin except for the bonding pads. In case of joining the circuit formation face to the inner leads, if the semiconductor chip is joined to the inner leads by using an adhesive applied near the outer peripheral edge of the semiconductor chip, it has been found that the surface protective layer made of a resin is peered off or rolled up from the outer periphery by the thermally distorted adhesive and inner leads. When the protective layer is peeled off from the edge part, it is assumed that a crack occurs along the inner lead in the package body made of a resin, that is, an inconvenience in the form of a so-called resin crack occurs.

In case of joining the inner leads and the circuit formation face using an insulating tape, the insulating tape typically has a thickness of about 50 $\mu$m. In contrast, in case of directly joining the inner leads to the circuit formation face with an adhesive, the thickness of the adhesive can be suppressed to about 10 $\mu$m. Although it is an advantage that the thickness of an LSI package can be reduced in this way, this approach leads to a problem due to the fact that the inner leads are close to the circuit formation face of the semiconductor chip. The semiconductor chip is manufactured in such a manner that a semiconductor wafer is formed, and after that, the semiconductor wafer is cut along scribing lines in a dicing process into semiconductor chips. Since dummy elements and metal wiring used for an evaluation pattern are formed in the scribing lines, a group of circuit wires made of metal, such as aluminum, remains as remnants in a part around each semiconductor chip substrate. If the remnants remain, since the remnants have a height of about 10 μm from the circuit formation face in the outer peripheral part of the semiconductor chip, there is a fear that the remnants may be brought into contact with the inner leads, causing the remnants and the inner leads to be short-circuited.

The occurrence of remnants is not a problem when the semiconductor chip and the inner leads are joined by using an insulating tape having a thickness of about 50 μm. In case of directly joining the semiconductor chip and the inner leads by using only an adhesive with a thickness of about 10 μm, however, it is assumed that the above-mentioned problem occurs when the inner leads approach the circuit formation face.

It can be considered that if the above-mentioned problems exist, it is difficult to manufacture a high-quality semiconductor device of the LOC structure with a good yield.

It is, therefore, an object of the present invention to provide a technique which can promptly manufacture a semiconductor device of the LOC structure and efficiently improve manufacturing efficiency of the semiconductor device.

It is another object of the present invention to provide a technique which can manufacture a high-quality semiconductor device having the LOC structure with a good yield.

The above and other objects and novel features of the present invention will become apparent from the following description in this specification and the accompanying drawings.

Among the features disclosed in this application, the outlines of representative aspects of the present invention will be briefly described as follows.

According to the present invention, there is provided a semiconductor device in which a plurality of inner leads are arranged on a circuit formation face of a semiconductor chip encapsulated with a resin, and external terminals (bonding pads) formed on the circuit formation face are electrically connected to the inner leads. Only the inner leads arranged on both ends of the semiconductor chip among the plurality of inner leads are selectively joined to the circuit formation face of the semiconductor chip using an adhesive.

According to the present invention, a semiconductor chip is connected to at least four inner leads positioned on both end parts of the semiconductor chip without joining all of inner leads and the semiconductor chip, so that the area in which the adhesive is applied is reduced and the adhesive can be promptly applied. Further, in case of forming the package body using a resin, a semiconductor package is stably held by a lead frame in a molding die. Consequently, a high-quality semiconductor device can be manufactured with a good yield.

The semiconductor device of the present invention has a feature such that a plurality of inner leads includes inner leads having joining parts which are joined to a circuit formation face of a semiconductor chip using an adhesive, and a bent part for absorbing stress at the time of temperature cycling is formed in each inner lead having the joining part.

According to the present invention, even when stress is concentrated on the joining part of the inner lead and the chip, the stress is absorbed by the bent part. Consequently, the occurrence of a large stress or distortion in the circuit formation face or the inner leads is prevented, and further, the surface protective layer covering the circuit formation face is prevented from being peeled off.

Further, according to a semiconductor device of the present invention, a plurality of inner leads include inner leads having joining parts to be joined to the circuit formation face of the semiconductor chip with an adhesive. A gap between the circuit formation face and a part of each of the inner leads having joining parts, which extends over the outer peripheral edge of the semiconductor chip, is set to be higher than the height of remnants occurring in the outer periphery of the semiconductor chip.

According to the present invention, even when the thickness of the adhesive used to join the inner leads to the chip is as thin as about 10 μm, it is possible to prevent remnants which may occur in the outer peripheral edge of the semiconductor chip from coming into contact with the inner leads.

In accordance with the present invention, the inner lead may have a joining part and a bent part. The joining part also can be formed in the inner lead connected to a bus bar (power source lead).

A method of manufacturing a semiconductor device of the present invention comprises the steps of: preparing a lead frame having a plurality of inner leads and a plurality of outer leads continuous to the inner leads, respectively; preparing a semiconductor chip having a square-shaped circuit formation face on which a semiconductor integrated circuit is formed; applying an adhesive to the inner leads arranged on both ends of the semiconductor chip among the inner leads; joining the semiconductor chip to the lead frame with the adhesive; electrically connecting electrodes arranged on the circuit formation face of the semiconductor chip and the inner leads; and forming a resin encapsulating body by arranging the lead frame to which the semiconductor chip is joined in a resin molding die, and after that, injecting a melt encapsulation resin into the resin molding die in a state where the semiconductor chip is held by the lead frame at both end parts.

According to the present invention, when the inner leads positioned on both ends of the semiconductor chip are joined and the package body is formed by using the resin, the encapsulation resin in a melted state is injected into the resin molding die in a state where the semiconductor chip is held at both ends by the lead frame. Consequently, the semiconductor chip is not deviated from the lead frame in the die and a high-quality semiconductor device therefore can be manufactured.

BRIEF DESCRIPTION OF THE DRAWINGS

FIGS. 2(A) and 2(B) are cross sections taken on lines 2—2 and 2'—2' of FIG. 1, respectively;

DESCRIPTION OF THE PREFERRED EMBODIMENTS

Various embodiments of the present invention will be described in detail hereinafter with reference to the drawings.

Figure 1:
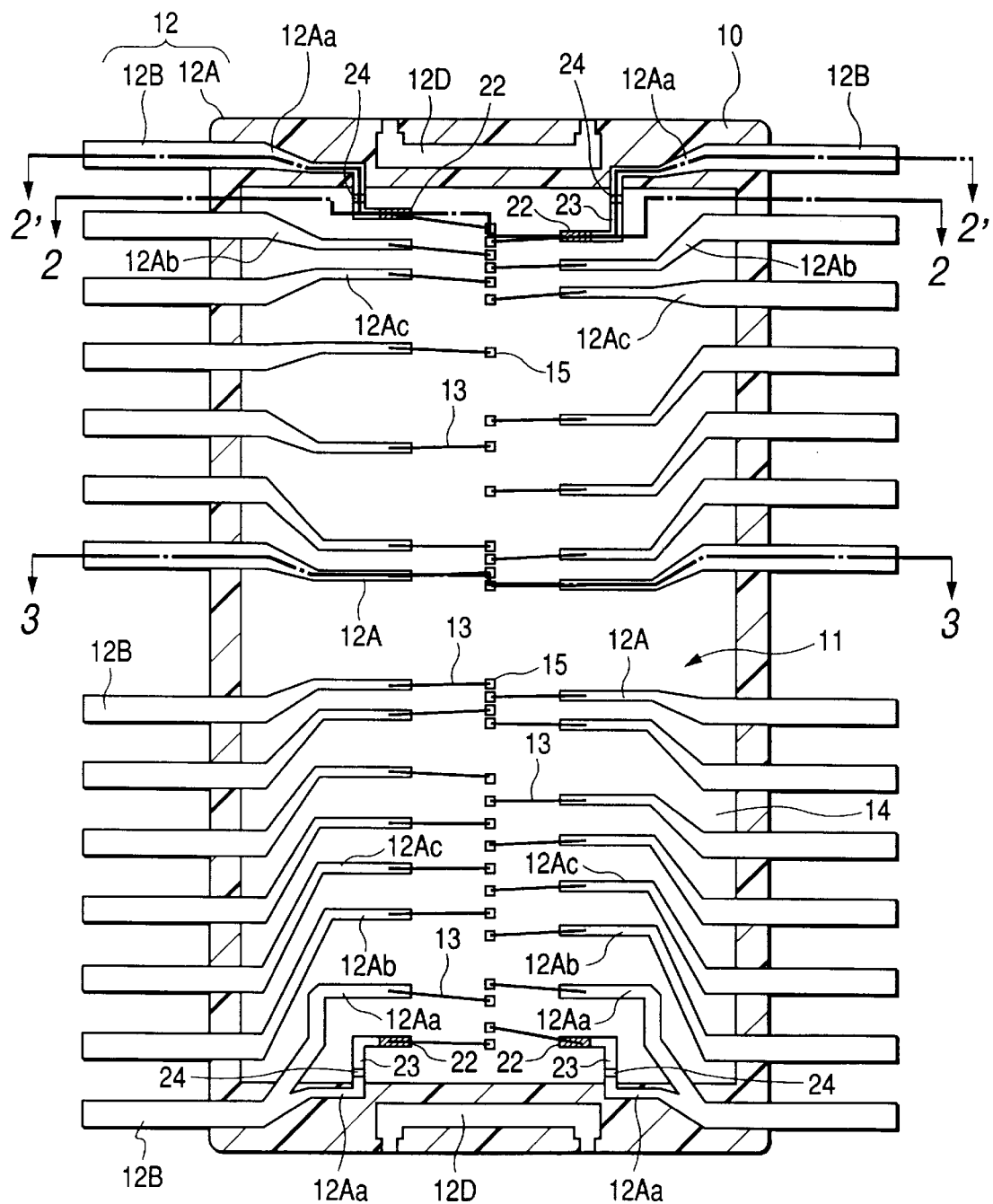
FIG. 1 is a plan view of a main part of a semiconductor package forming a first embodiment of the present invention.
Figure 3:
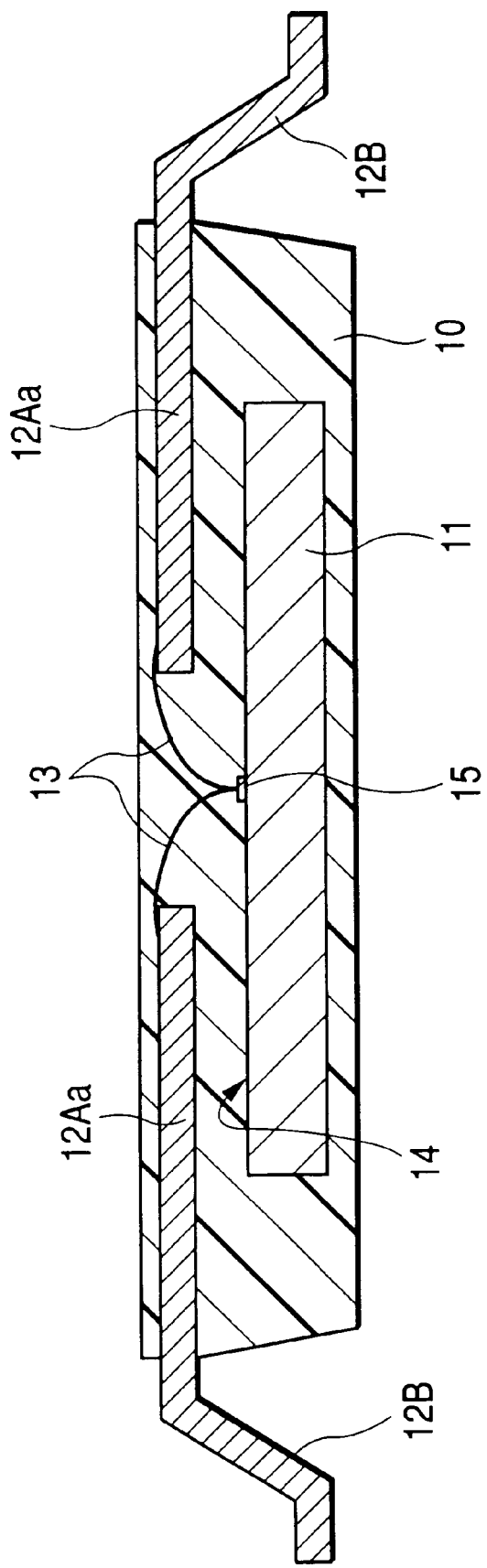
FIG. 3 is a cross section taken on line 3—3 of FIG. 1.

FIG. 1 is a plan view illustrating a semiconductor device according to an embodiment of the present invention. FIGS. 2(A) and 2(B) are cross sections taken on lines 2—2 and 2'—2' of FIG. 1, respectively. FIG. 3 is across section taken on line 3—3 of FIG. 1.

The illustrated semiconductor device is a TSOP, representing a kind of surface mount type LSI package. In a resin encapsulating body 10 made of an epoxy resin formed by transfer molding, a semiconductor chip (hereinafter, simply called a "chip") 11 made of a single crystal silicon on which a memory LSI such as a DRAM (Dynamic Random Access Memory) is formed is encapsulated. Each of the chip 11 and the resin encapsulating body 10 has a rectangular shape, having two long sides which are in parallel and two short sides which are in parallel. The long and short sides are at right angles. The TSOP includes a plurality of leads 12 having outer lead parts 12B projecting from the resin encapsulating body to the outside and inner lead parts 12A arranged on the main face, that is, a circuit formation face of the chip 11. The leads 12 are made of a Cu or Fe alloy and are electrically connected to a number of bonding pads 15 serving as external terminals formed in a line in the central part of a circuit formation face 14 of the chip 11 via Au wires 13.

According to the TSOP, the thickness of the chip 11 is 0.28 mm, the plate thickness of the lead 12 is 0.07 to 0.125 mm, and the thickness of the resin encapsulating body 10 is about 0.6 to 1.0 mm.

The inner lead parts 12A are arranged on the circuit formation face 14 so as to extend from the long sides of the chip 11 toward the bonding pads 15 and are arranged at predetermined intervals in a direction parallel to the line of the bonding pads 15, that is, in the longitudinal direction of the chip 11. That is, on the inner side of each of the inner lead parts 12A$a$ positioned on both ends of the chip 11 (that is, positioned on the outermost sides of the chip 11), another inner lead part 12A$b$ neighboring the inner lead part 12A$a$ is positioned with a gap being provided therebetween. Further, on the other side of each inner lead part 12A$b$, another inner lead part 12A$c$, neighboring the inner lead part 12A$b$ with a gap, is positioned. In this manner, a predetermined number of inner lead parts 12A are spaced in the direction along the line of the pads of the chip 11. The inner lead part 12A$a$ serves as a power source lead (fixed potential lead) for supplying a power source potential and an earth potential and the inner lead parts 12A$b$ and 12A$c$ serve as signal leads.

In the TSOP, four inner lead parts 12A$a$, positioned on the outermost sides, and the chip 11 are joined with an adhesive 21 as shown in FIGS. 2(A) and 2(B) without using an insulating tape for joining all of the inner lead parts 12A to the circuit formation face 14 of the chip. As the adhesive 21, for example, a thermoplastic polyimide resin is used.

The position to which the inner lead part 12A$a$ is bonded to the chip 11 with the adhesive 21 is slightly on the inner side of the edge of the chip 11. That is, the tip of each of the four inner lead parts 12A$a$ serves as a joining part 22 to be joined to the circuit formation face 14 with the adhesive 21. The joining parts 22 are shown by hatched parts in FIG. 1. Each of the wires 13 is connected onto a face of the inner lead part 12A$a$ opposite to the face on which the adhesive 21 is applied.

Consequently, the chip 11 is joined to the four inner lead parts 12A positioned on the outermost sides and the other inner lead parts 12A$a$ positioned on the inner sides are not joined on the chip 11, as shown in FIG. 3. Although the chip 11 shown in the diagram is bonded to a total of four inner lead parts 12A$a$ positioned on both ends, the chip 11 may also be joined to a total of eight inner leads including the four inner lead parts 12A$b$ on the inner sides of the four inner leads 12A$a$. Although the adhesive 21 is applied on selected spots in the illustrated case, the adhesive 21 also can be applied in a wider range or to all of the inner lead parts 12Aa which overlap the circuit formation face 14.

As mentioned above, since the number of parts to which the adhesive 21 is applied is four or eight when all of the inner lead parts 12A are not joined to the chip 11, the joining area can be reduced. Since the work of applying the adhesive using an apparatus, such as dispenser for applying the adhesive 21, can be promptly performed and the amount of water absorbed by the adhesive can be reduced, the manufacturing efficiency of the semiconductor device can be improved. Since the chip 11 is joined to the inner lead parts 12Aa on the outermost sides, in a resin forming step using a transfer molding apparatus for forming the resin encapsulating body 10, a desired resin shape can be formed, and the chip 11 will not deviate from the lead frame or be inclined by the pressure of injection of the resin even when the resin is injected into the cavity of the die in a state where the chip 11 joined to the lead frame is arranged in the resin molding die.

Figure 4A:
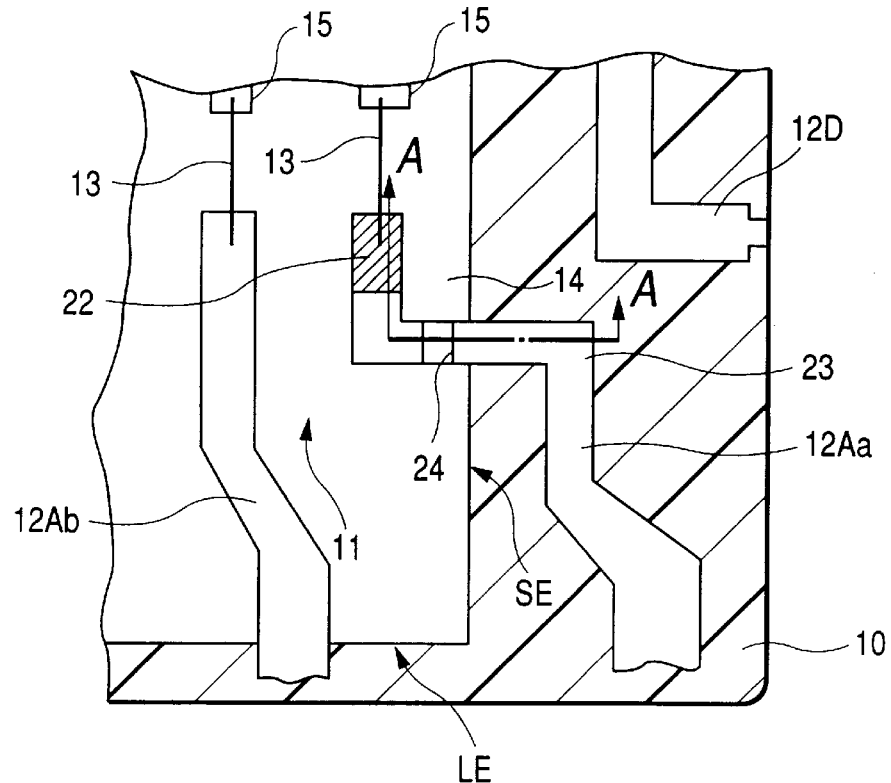
FIG. 4(A) is an enlarged plan view partially showing a part around an inner lead 12A$a$ in FIG. 1.

FIG. 4(A) enlargedly shows one of the four inner lead parts 12Aa each having the joining part 22 shown in FIG. 1. The inner lead part 12Aa has a bent part 23 which is bent at an almost right angle with the joining part 22 along the circuit formation face 14 of the chip 11. When the illustrated TSOP as a semiconductor device is used, the semiconductor device is subjected to a thermal load by a change in temperature in the environment. In this case, since the materials of the chip 11, the inner lead parts 12A, the adhesive 21, and the encapsulating body 10 which make up the semiconductor device are different, the coefficients of thermal expansion of these parts are accordingly different. Thus, it can be seen that thermal expansion or thermal contraction will not occur uniformly in the whole semiconductor device, but a thermal stress is concentrated on the joining part 22 by the temperature change, that is, by the temperature cycling.

Since each inner lead part 12Aa having the joining part 22 includes the bent part 23, however, the thermal stress is absorbed by the bent part 23. Therefore, breakage of the inner lead part 12Aa can be prevented. As a result, an effect wherein a high-quality semiconductor device having excellent durability can be obtained while increasing the manufacturing efficiency of the semiconductor device.

In case of joining the inner lead part 12Aa to the chip 11 with the adhesive 21, the thickness of the adhesive 21 can be set to about 10 $\mu$m, which is thinner than that of an insulating tape. On the other hand, in ease of manufacturing the chip 11, after a number of semiconductor integrated circuits corresponding to a predetermined number of chips are formed on a wafer, the wafer is cut on a chip unit basis in a dicing process. There is, however, a case where remnants occur along a part of the outer peripheral edge E of the chip 11 at the time of cutting in the dicing process. The remnants are formed almost vertically from the edge E on the circuit formation face 14. It has been found that the height of the remnant is about 10 $\mu$m.

When the inner leads 12A including the joining parts 22 are extended in parallel on the circuit formation face 14, if remnants occur, the inner lead parts 12Aa come into contact with the remnants. If the remnants are those of a circuit wiring part made of a metal, the remnants and the inner leads 12 are short-circuited. If the remnants are those of the substrate part of the chip 11, the remnants and the substrate are short-circuited.

Figure 4B:
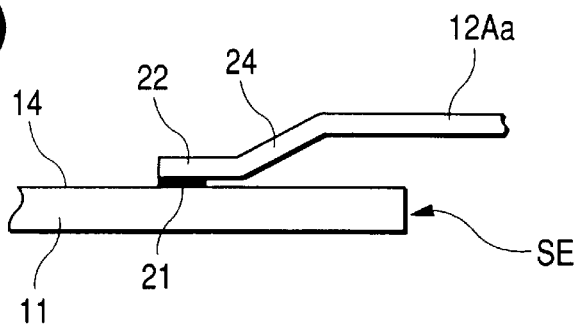
FIG. 4(B) is a cross section taken on line A—A of FIG. 4(A)

As shown in FIG. 4(B), the dimension between the circuit formation face 14 of the chip 11 and a part of the inner lead part 12Aa having the joining part 22, which extends over the outer peripheral edge E of the chip 11, is set to be higher than the height of any remnant which may be present on the chip outer periphery. In order to set the dimension, a step 24 inclined in a direction away from the circuit formation face 14 toward the outer lead part 12B is formed in the part which is over the outer peripheral edge E in the inner lead part 12Aa. The illustrated step 24 is positioned inward of the edge E of the chip 11. By forming the step 24 in this manner, even when the inner lead part 12Aa is joined to the chip 11 by using the thin adhesive 21, the contact of the inner lead part 12Aa and the remnants can be avoided. Thus, a high-quality semiconductor device can be obtained with a good yield.

As mentioned above, the effect of avoiding any contact between the inner lead part 12A and-the remnants is obtained also in the case where all of the inner lead parts 12A have the joining parts 22 and the chip 11 and all of the inner lead parts 12A are joined.

Figure 4C:
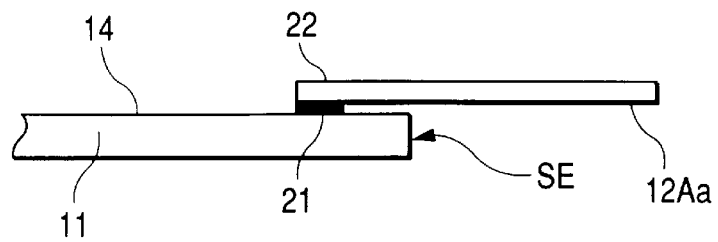
FIG. 4(C) is a cross section showing a modification of FIG. 4(B)

FIG. 4(C) is a cross section showing a part which corresponds to that of FIG. 4(B) of a semiconductor device according to a modification of the present invention. In this case, in a manner similar to the case of the insulating tape, the adhesive 21 is applied thickly so that the thickness is about up to 50 $\mu$m. In this case, since a gap between the inner lead part 12A and the circuit formation face 14 is sufficiently larger than the height of any remnant which may occur, with the adhesive 21 being thickly applied in this way, any contact between the inner lead part 12A and remnants can be avoided without forming the step 24 as mentioned above.

In the semiconductor device shown in FIG. 1, although the bonding pads 15 serving as electrodes are formed in a line in the center part of the chip 11, the bonding pads 15 may be formed in two lines in the center part of the chip 11. In this case, the joining part 22 of the inner lead part 12Aa is positioned close to the long side of the chip 11 and the joining parts 22 of the four inner lead parts 12Aa are positioned at the four corners of the chip 11, so that a deviation or inclination of the chip 11 in the die can be certainly prevented upon formation of the encapsulation body 10. It is also possible that the joining parts 22 are positioned at the four corners of the chip 11 even if the bonding pads 15 are formed in a line as shown in the diagram.

Figure 5:
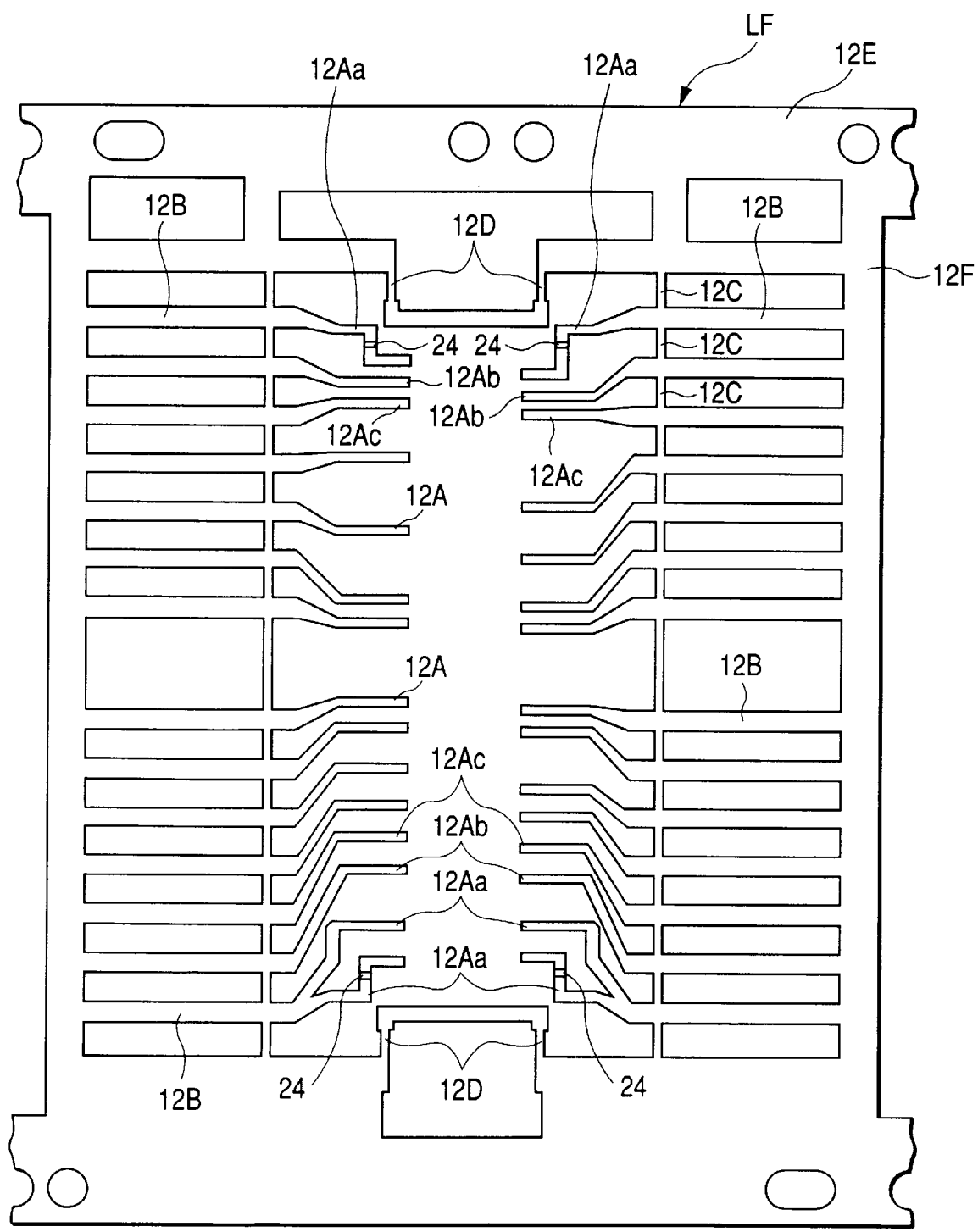
FIG. 5 is a plan view showing a main part of a lead frame for manufacturing the semiconductor device shown in FIG. 1.

The procedure for manufacturing a TSOP as the above-mentioned semiconductor device will be described. First, a lead frame LF having the shape as shown in FIG. 5 is prepared. The lead frame LF includes outer frames 12E and 12F, dam bars 12C connecting the leads 12, and suspension leads 12D. A structure in which about five or six lead frames LF are continuous is actually employed. FIG. 5 shows only a part corresponding to one of the 20 packages. The step 24 is formed only at the end part of each of the inner lead parts 12Aa on the outermost sides of the lead frame LF so as to be offset.

Figure 6:
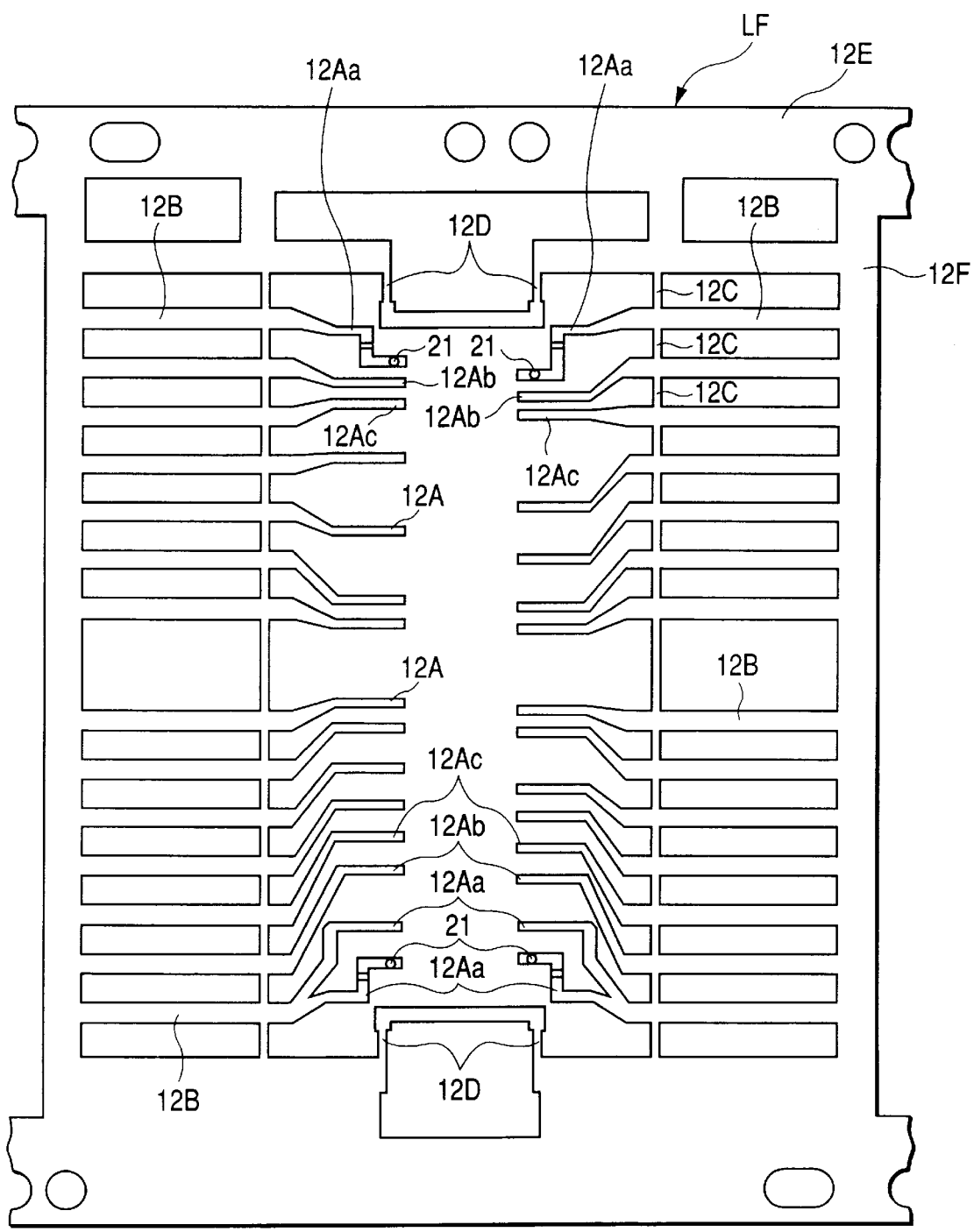
FIG. 6 is a plan view showing a state in which an adhesive is applied to inner lead parts positioned on the outermost sides of the lead frame shown in FIG. 5.

As shown in FIG. 6 corresponding to the back face of FIG. 5, an adhesive 21 is applied in spots on the back face of the four inner lead parts 12Aa on the outermost sides among the inner lead parts 12A in the lead frame LF, that is, on a surface facing the chip 11 by using a dispenser or the like. It is also possible fir the adhesive 21 to be applied to the whole part overlapping the circuit formation face 14 of the chip 11 among the inner lead parts 12Aa, or an adhesive in a sheet state, which is preliminarily cut in a size corresponding to the overlapped part, may be joined to the joining parts 22 without using the dispenser.

Figure 7:
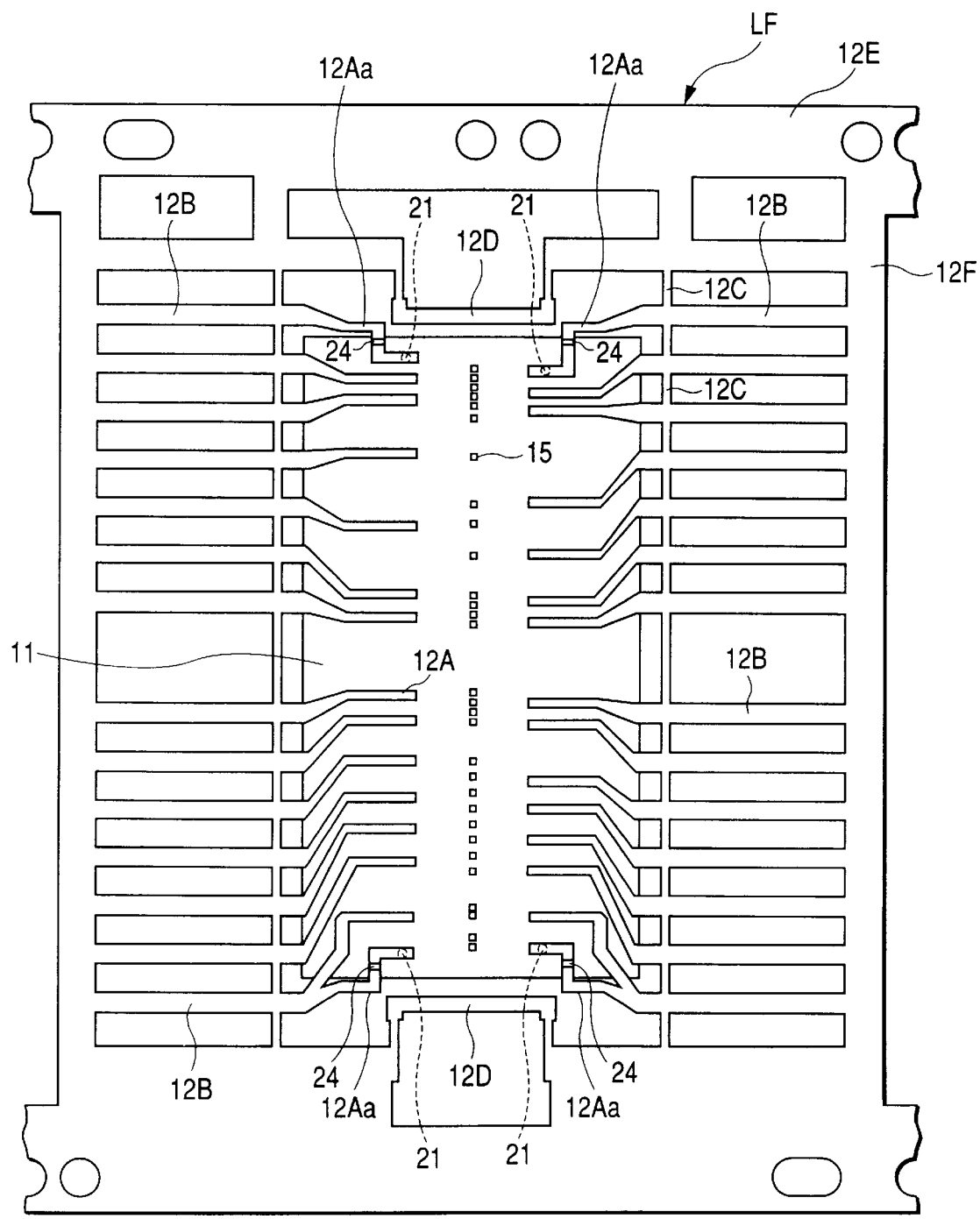
FIG. 7 is a plan view showing a state in which a chip is joined to the lead frame shown in FIG. 6.

The chip 11 has been prepared by predetermined processes and has a rectangular shape. As shown in FIG. 7, the chip 11 is positioned at a predetermined position on the lead frame LF so that the circuit formation face of the chip 11, that is, the main surface faces the rear face of the inner lead parts 12A. The joining parts 22 are brought into contact with the circuit formation face 14 and are joined with the adhesive 21. The chip 11 is joined to the four joining parts 22, which are arranged in such a manner that two of the joining parts 22 are arranged at each end of the chip 11.

Figure 8:
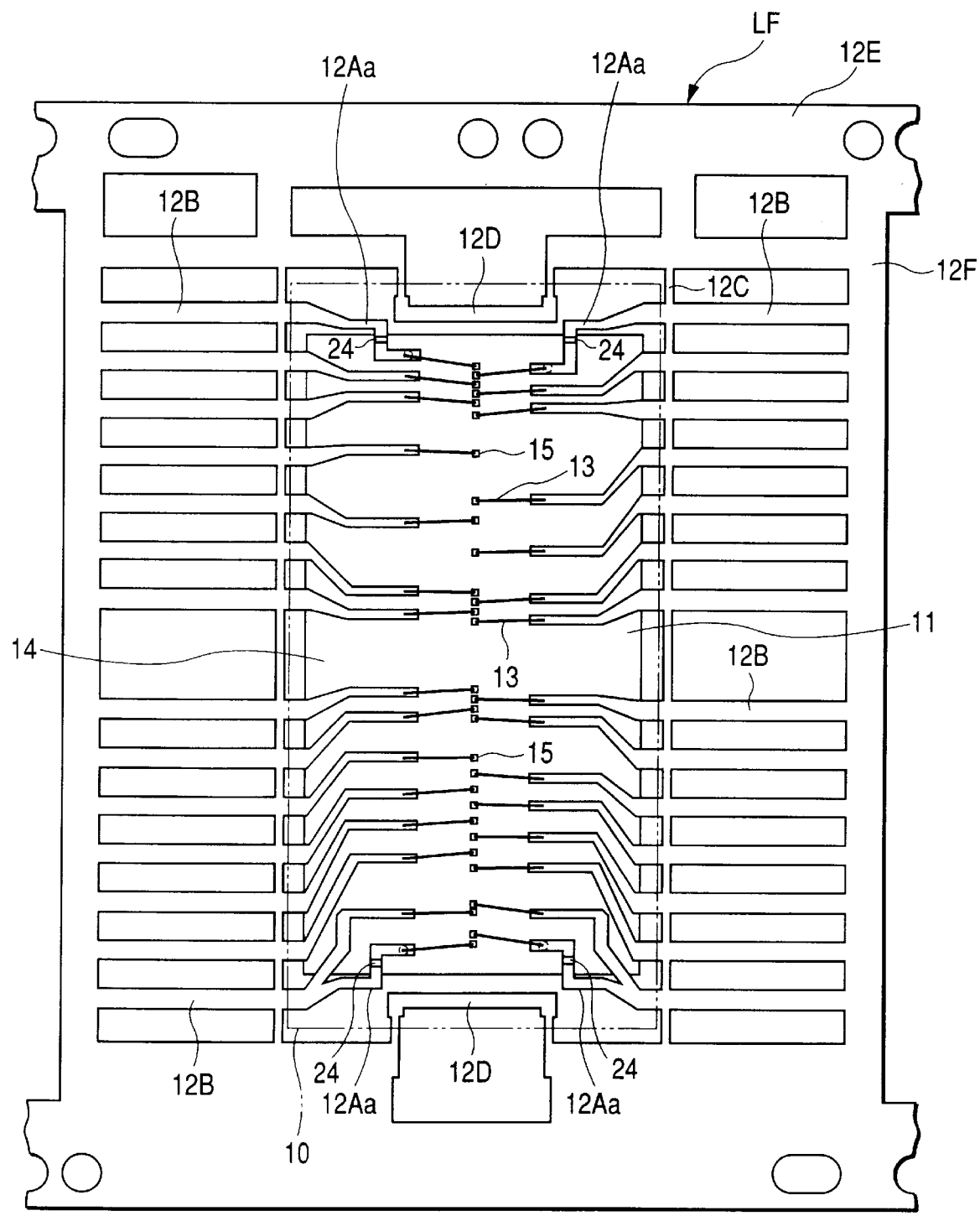
FIG. 8 is a plan view illustrating a state in which wires are connected between bonding pads and the inner leads in the lead frame shown in FIG. 7.
Figure 9:
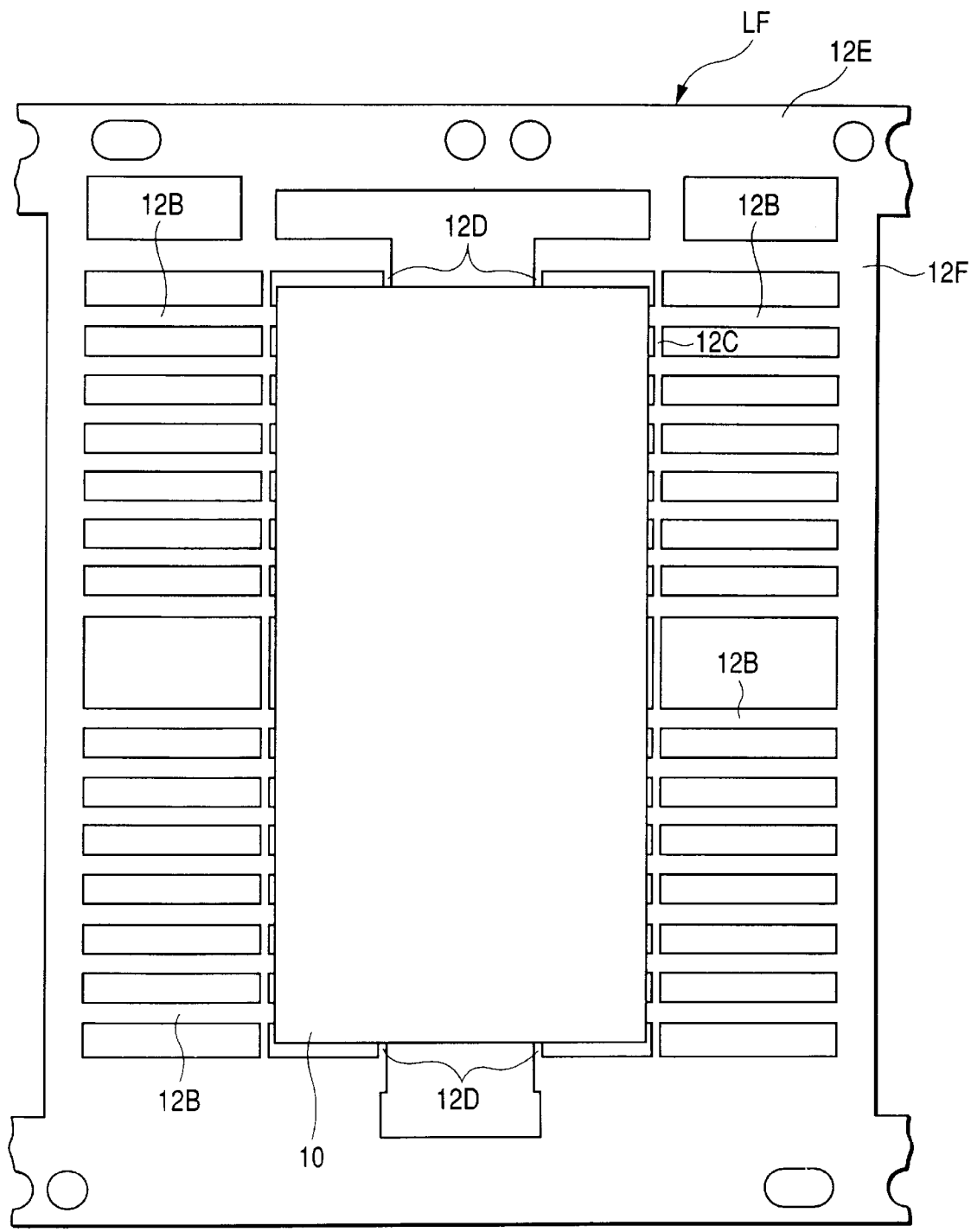
FIG. 9 is a plan view showing a state in which a chip is encapsulated with a resin in the lead frame shown in FIG. 8.
Figure 10:
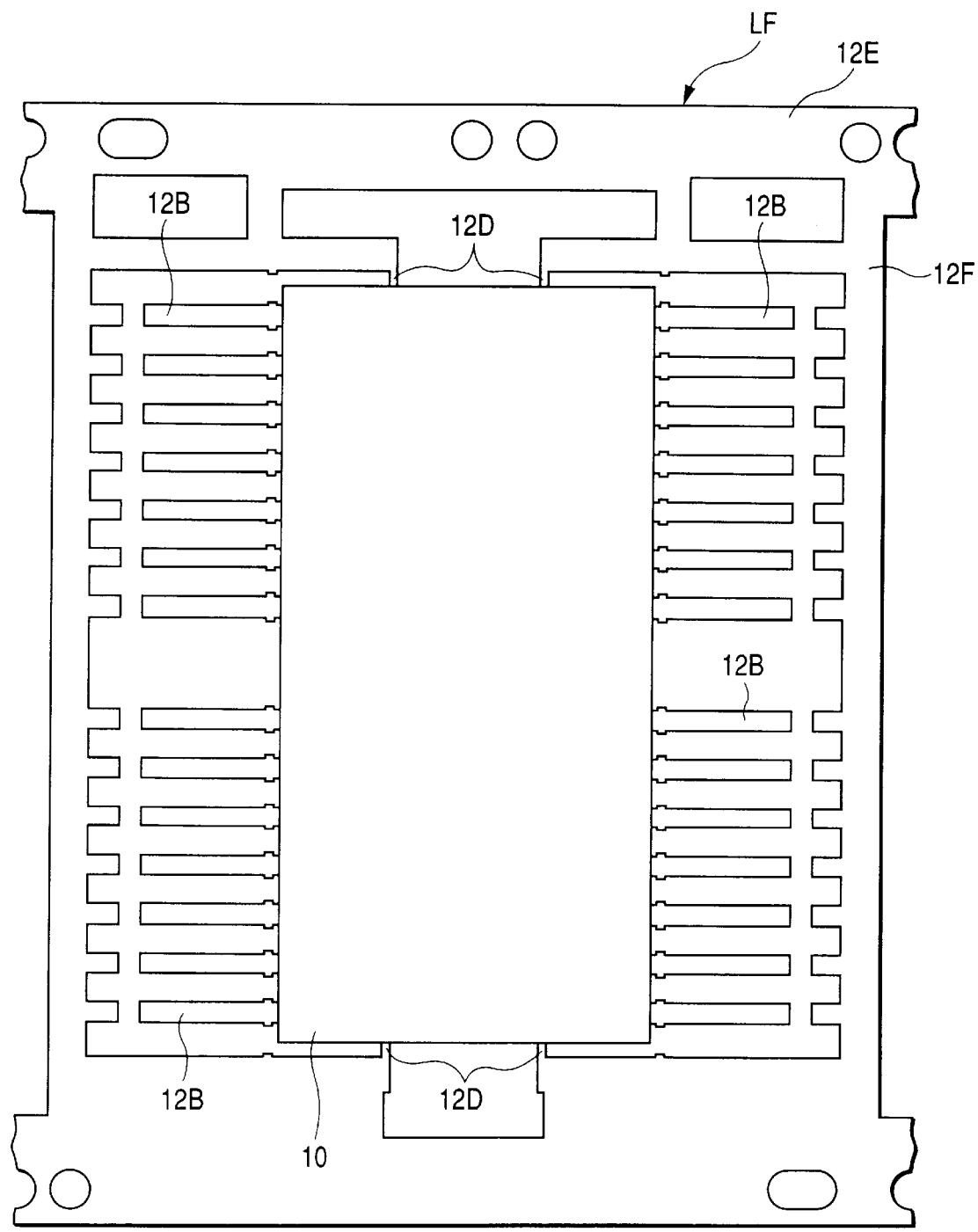
FIG. 10 is a plan view illustrating a state in which dam bars and outer leads are cut in the lead frame shown in FIG. 9.
Figure 11:
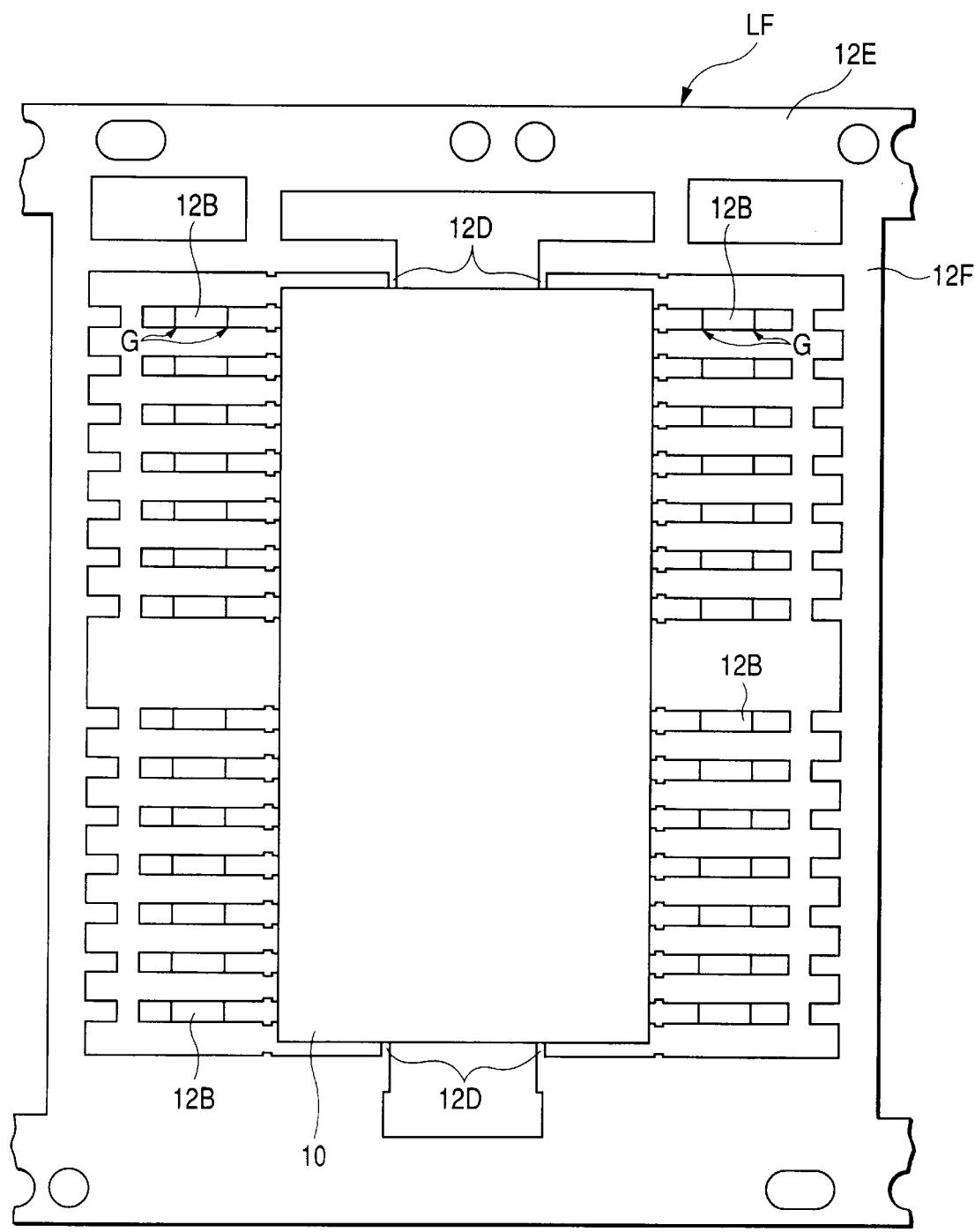
FIG. 11 is a plan view illustrating a state in which leads are formed in the lead frame shown in FIG. 10.
Figure 12:
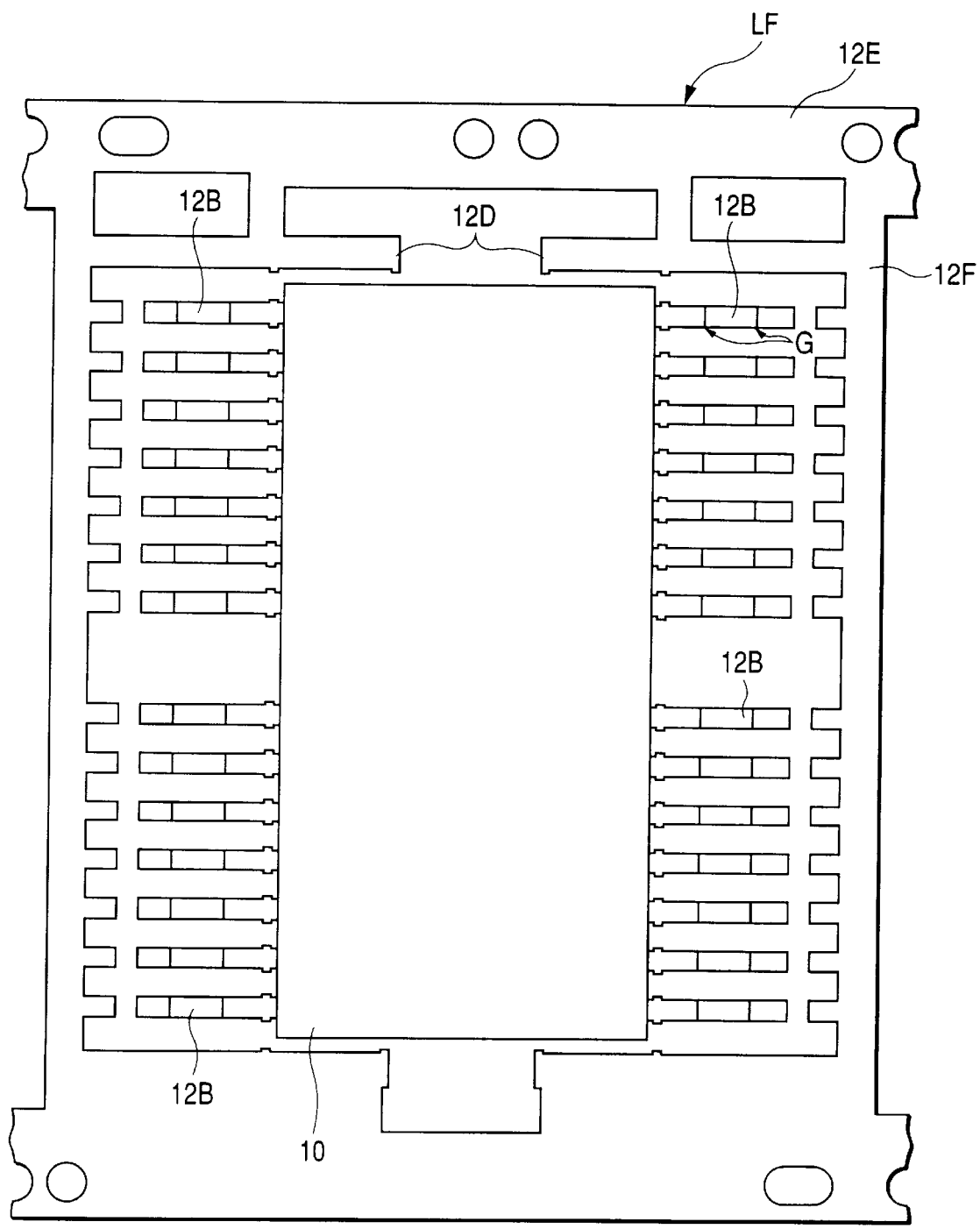
FIG. 12 is a plan view illustrating a state in which suspension leads are cut in the lead frame shown in FIG. 11.

FIG. 8 shows a state in which the bonding pads 15 of the chip 11 and the inner lead parts 12A are bonded via the Au wires 13 in a wire bonding process and are electrically connected. The chip 11 is bonded and fixed in this manner, the lead frame LF to which the wires 13 are connected is conveyed to an encapsulating process, and the resin encapsulating body 10 is formed by a transfer molding apparatus, thereby encapsulating the chip 11, as shown in FIG. 9. After that, as shown in FIG. 10, the ends of the dam bars 12C connecting the outer lead parts 12B in the lead frame LF and the outer lead parts 12B which are exposed from the resin encapsulating body 10, as shown in FIG. 10, are sequentially cut. Subsequently, as shown in FIG. 11, the outer leads 12B are bent in a predetermined shape, for example, at lines G. The suspension leads 12D remain without being cut so that the package is not separated from the lead frame LF upon formation of the leads. After that, as shown in FIG. 12, by cutting the suspension leads 12D, the TSOP shown in FIGS. 1 to 3 is completed.

Figure 13:
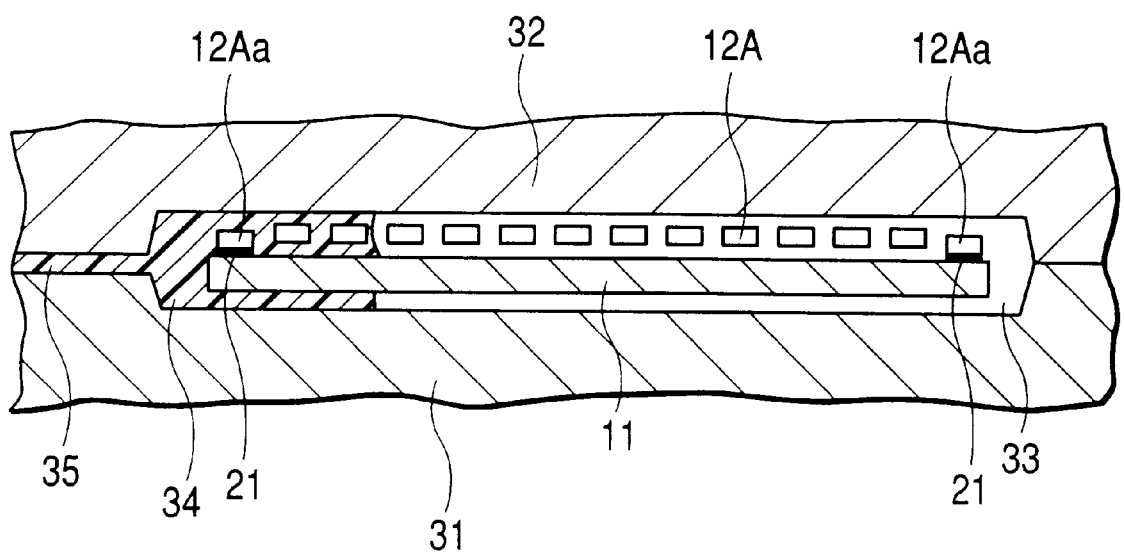
FIG. 13 is a cross section illustrating a molding die for molding a resin encapsulating body of the package shown in FIG. 1.

FIG. 13 is a diagram showing a state in which the resin encapsulating body 10 is formed by a transfer molding apparatus. A cavity 33 corresponding to the shape of the resin encapsulating body 10 is formed by a first die 31 and a second die 32 of the molding apparatus. A melted epoxy resin 34 is injected into the cavity 33 from a gate 35 formed in the dies 31 and 32 in correspondence to the center part of one of the short sides of the chip 11. In this case, since the chip 11 is held at a total of four positions of the two positions each on both sides of the lead frame LF, even when the resin 34 is injected into the chip side and the opposite side of the lead frame LF with a different timing, the chip 11 is not deviated or inclined from the lead frame LF. Consequently, the chip 11 is encapsulated in a desired position in the lead frame LF, so that a high-quality semiconductor device can be manufactured with a good yield.

(embodiment 2)

Figure 14:
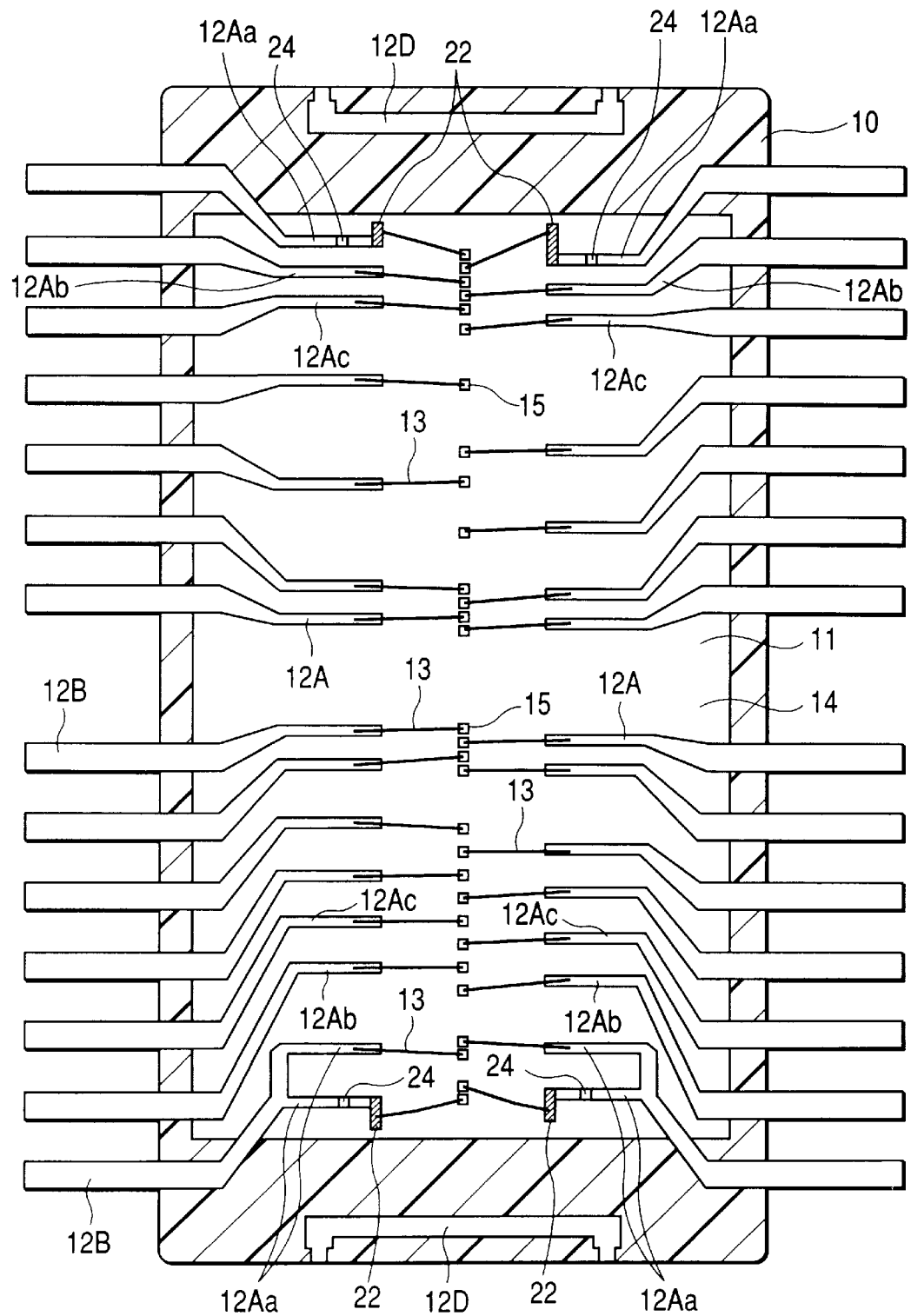
FIG. 14 is a plan view showing a main part of a semiconductor package representing a second embodiment of the present invention.
Figure 15A:
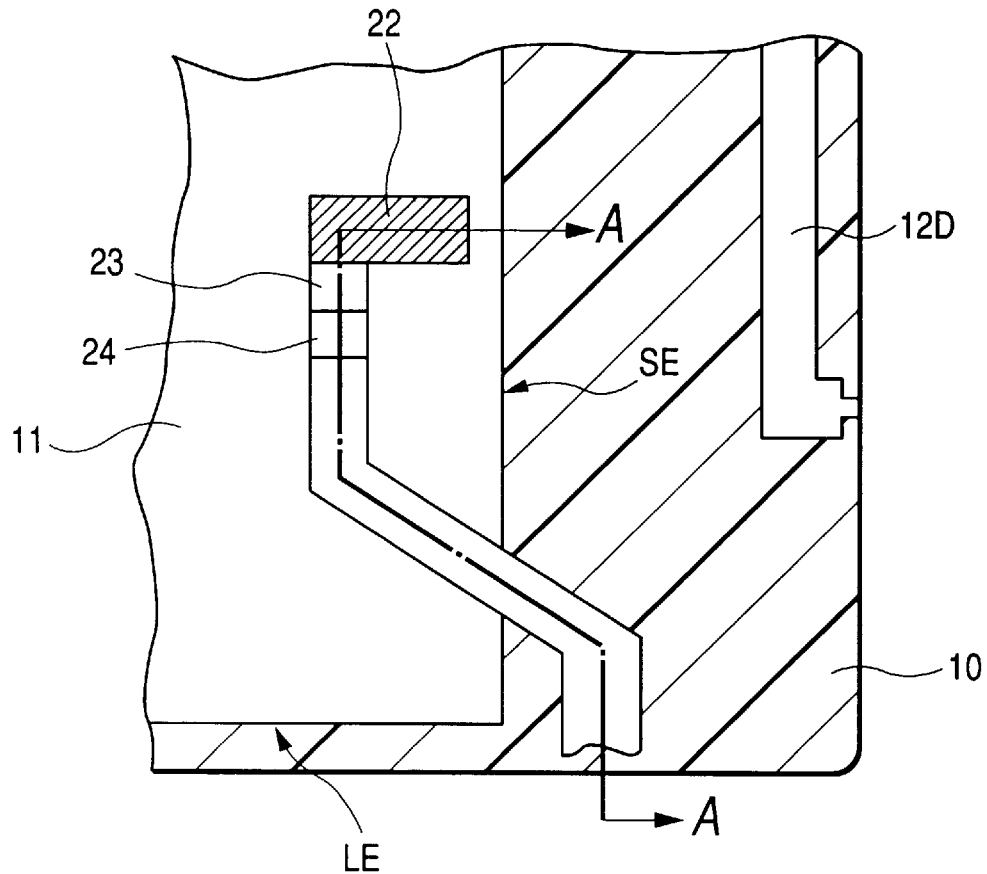
FIG. 15(A) is an enlarged plan view partially illustrating a part around an inner lead 12A$a$ shown in FIG. 14.
Figure 15B:
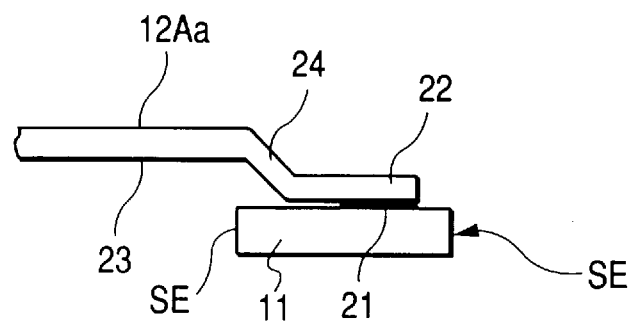
FIG. 15(B) is a cross section taken on line A—A of FIG. 15(A)

FIG. 14 and FIGS. 15(A) and 15(B) show a semiconductor device according to another embodiment of the present invention. Although the joining parts 22 are oriented in the width direction of the chip 11 in the foregoing embodiment, in this semiconductor device, they are oriented in the longitudinal direction of the chip 11. In this manner, the orientation of the joining parts 22 or the bent parts 23 can be set in arbitrary directions in accordance with the layout of the inner leads 12A. The step 24 formed in the inner lead parts 12Aa in this case is formed in the region of the chip 11. The step 24 may be formed at any position as long as a sufficient gap between the chip 11 and the remnants, which may be present at the edge E of the outer periphery of the chip but not come into contact with the inner lead parts 12Aa, can be obtained. FIG. 15(B) is a cross section taken on line A—A of FIG. 15(A).

Figure 16A:
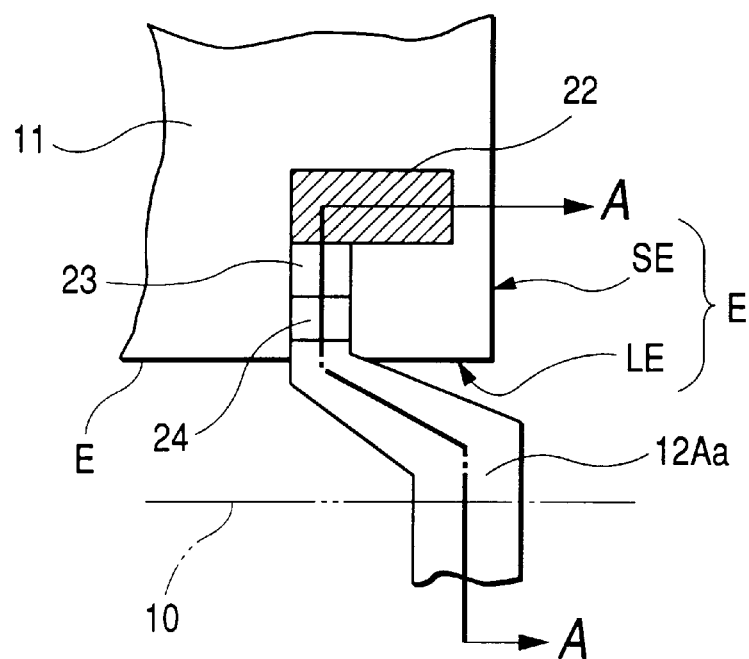
FIG. 16(A) is an enlarged plan view showing a main part of a semiconductor package representing a modification of the second embodiment of the present invention.

FIG. 16(A) is an enlarged view of a modification of the inner lead parts 12Aa shown in FIG. 14. Although the bent part 23 of the inner lead part 12Aa, which is positioned on the outermost side of the chip 11, has a bonding part 22 which crosses the short side SE of the chip 11 in the embodiment of FIG. 14, the bent part 23 in this arrangement crosses the long side LE, as seen in FIG. 16(A). When lines of the bonding pads 15 are positioned relatively near the long side like the case where the bonding pads 15 are formed in two lines in the central part in the width direction of the chip 11, the bonding parts 22 are positioned near the long side as well, so that the inner lead parts 12Aa cross the long side.

Figure 16B:
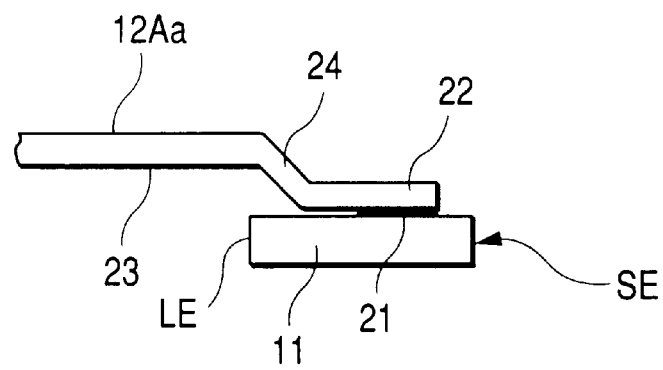
FIG. 16(B) is a cross section taken on line A—A of FIG. 16(A)

FIG. 16(B) is a cross section taken on line A—A of FIG. 16(A) in which the encapsulating body 10 is omitted.

As shown in FIG. 16(A), adhesive 21 is applied near the outer peripheral edge E of the chip 11 in the semiconductor device. The inner lead pert 12Aa is joined near the chip outer peripheral edge E on the circuit formation face 14. The circuit formation face 14 of the chip 11 is formed by a surface protective layer made of a resin applied on the chip substrate in order to prevent undesirable influence by radiation rays, such as alpha-rays emitted to the circuit. The surface protective layer is peeled off when a strong peeling force is applied. Especially, as shown in FIG. 16(A), in the case where the adhesive 21 is applied near the edge E, it can be considered that the surface protective layer is peered off from the outer peripheral portion when the stress is concentrated on the joining parts 22 by temperature cycling. When the bent part 23 is formed in the inner lead part 12Aa, the bent part 23 absorbs the stress occurring in the joining part 22 due to temperature cycling. As a result, even when the adhesive 21 is applied near the edge E, the occurrence of the peeling of the surface protective layer is prevented. If peeling occurs, a crack will occur in the resin encapsulating body 10 along the inner lead part 12Aa and outside air and water may enter the resin encapsulating body 10 through the crack. In the illustrated semiconductor device, such a problem can be avoided.

The adhesive 21 can be applied on the outermost side of the chip 11 while preventing the occurrence of cracking and an effect is obtained wherein the chip 11 can be more stably held when the resin encapsulation is performed.

(embodiment 3)

Figure 17:
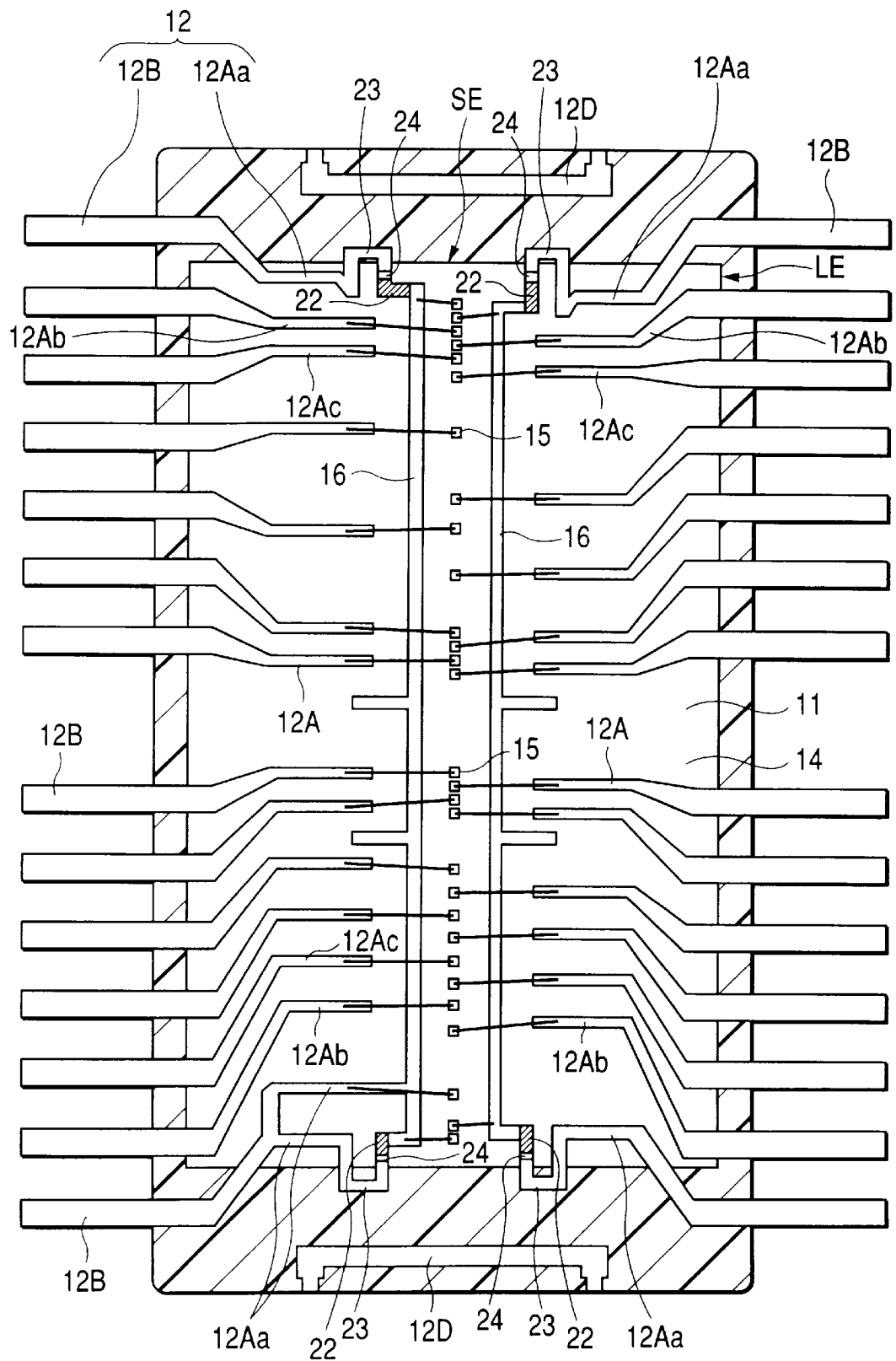
FIG. 17 is a plan view showing a main part of a semiconductor package representing a third embodiment of the present invention.
Figure 18:
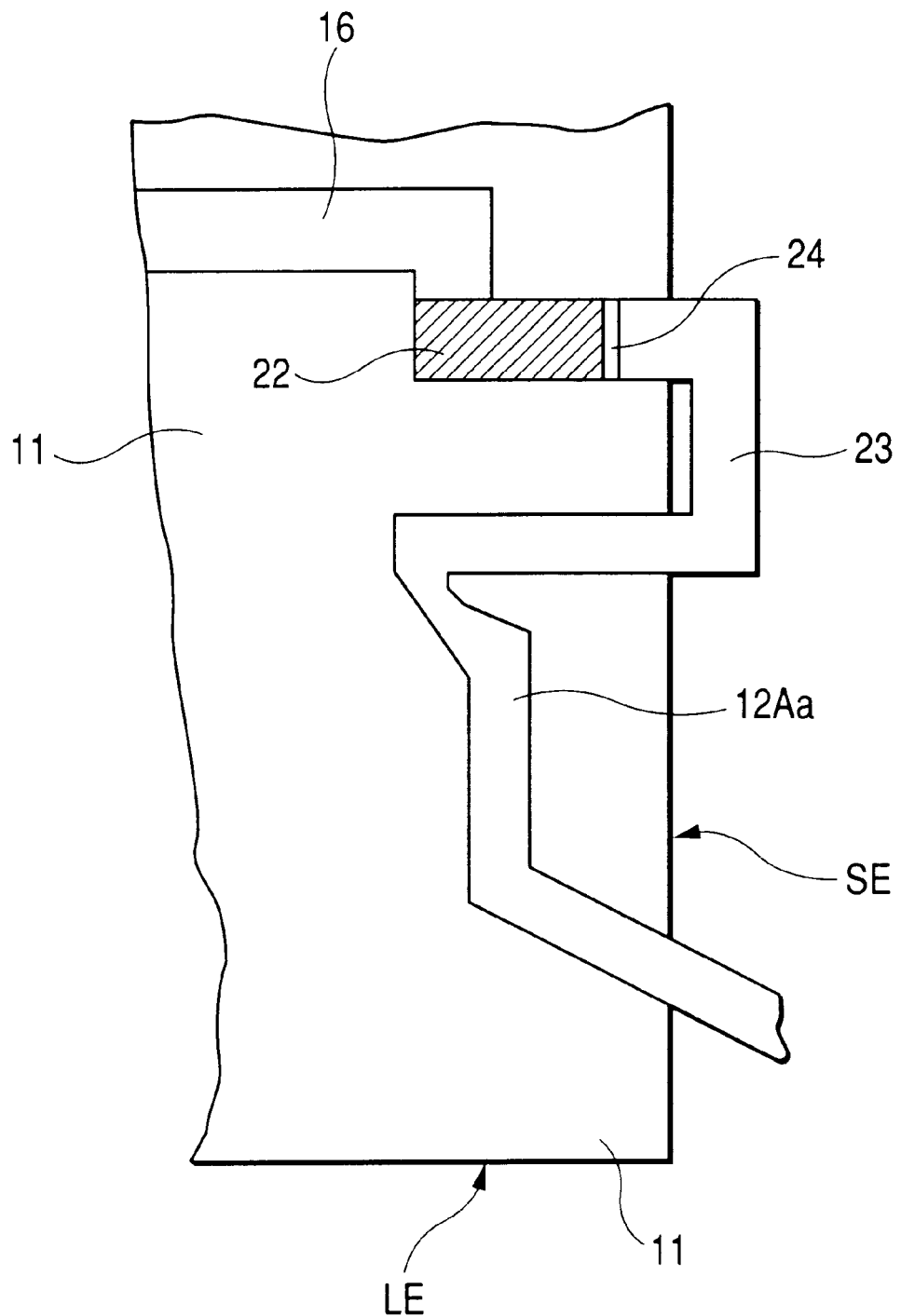
FIG. 18 is an enlarged plan view partially illustrating a part around an inner lead 12A$a$ shown in FIG. 17.

FIGS. 17 and 18 are diagrams showing a semiconductor device according to another embodiment of the present invention. The semiconductor device has bus bars 16. The bus bar 16 connects the inner lead parts 12Aa positioned on both ends of the chip 11 among the plurality of inner lead parts 12A arranged on the long sides of the chip 11. Each of the four inner lead parts 12Aa having the bus bar 16 includes a joining part 22 and a bent part 23 at right angles with the joining part 22. The inner lead part 12Aa has a portion of a U shape in plan view formed by the joining part 22 and the bent part 23. FIG. 18 is an enlarged view-of one of the four inner lead parts 12Aa having the bus bar 16.

(embodiment 4)

Figure 19:
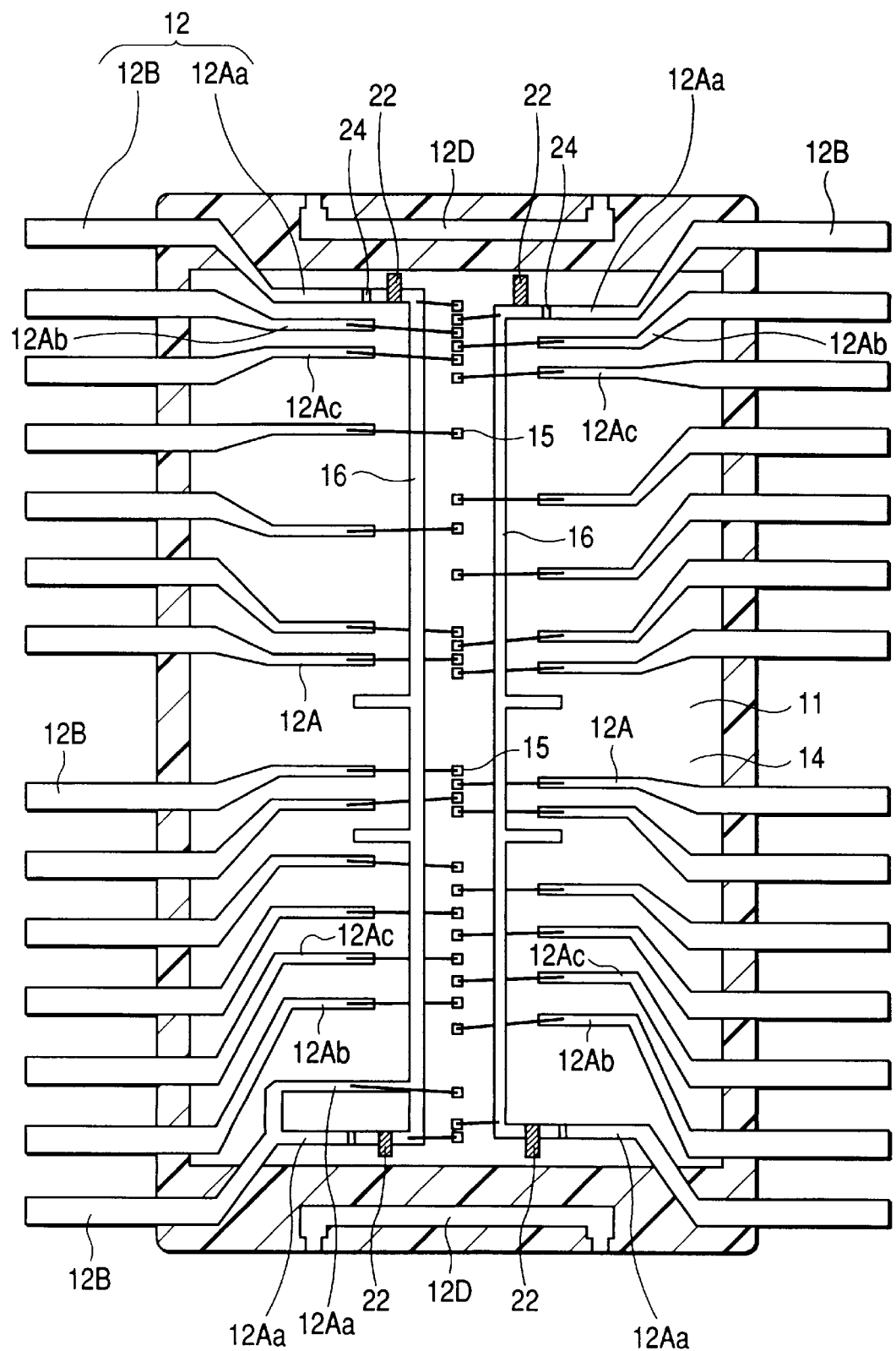
FIG. 19 is a plan view showing a main part of a semiconductor package according to a fourth embodiment of the present invention.
Figure 20:
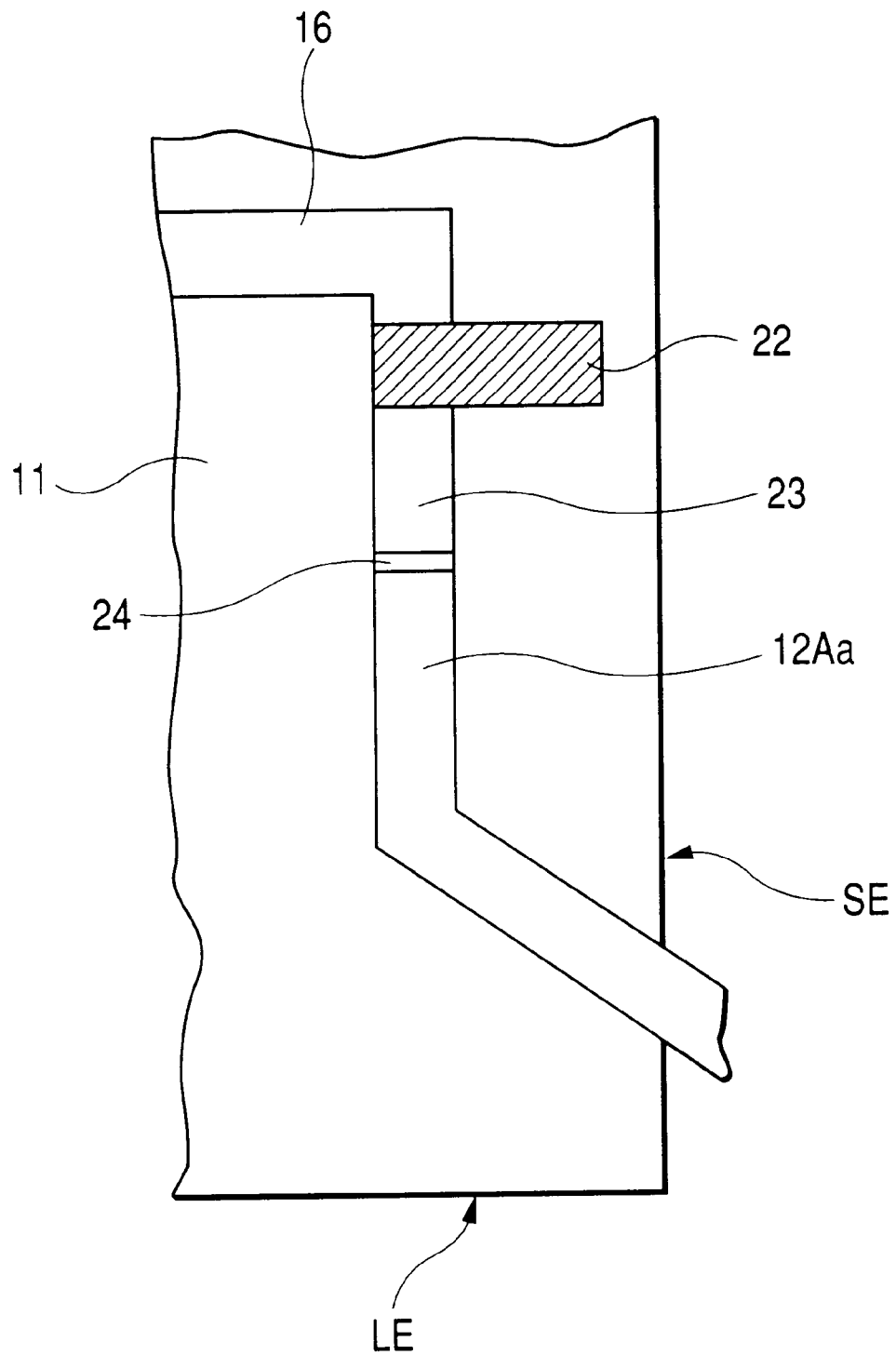
FIG. 20 is an enlarged plan view partially illustrating a part around an inner lead 12A$a$ shown in FIG. 19.

FIGS. 19 and 20 are diagrams showing a semiconductor device according to yet another embodiment. In a manner similar to the case shown in FIG. 17, the semiconductor device has a bus bar 16. In this case, the joining part 22 is formed at a right angle with the inner lead part 12Aa. A part of the inner lead 12Aa, to which the joining part 22 is connected, serves as the bent part 23. The joining part 22 and a part continued from the joining part 22 form a U-shape in plan view.

As shown in FIGS. 17 to 20, with respect to the semiconductor device of a type having the bus bar 16, although an example in which the step 24 is formed in the inner lead part 12Aa is shown, contact with remnants can be also avoided without forming the step 24 by applying the adhesive 21 thickly, as shown in FIG. 4(C). In the case of using the bus bar 16, the bus bar 16 may also have joining parts 22.

(embodiment 5)

Figure 21:
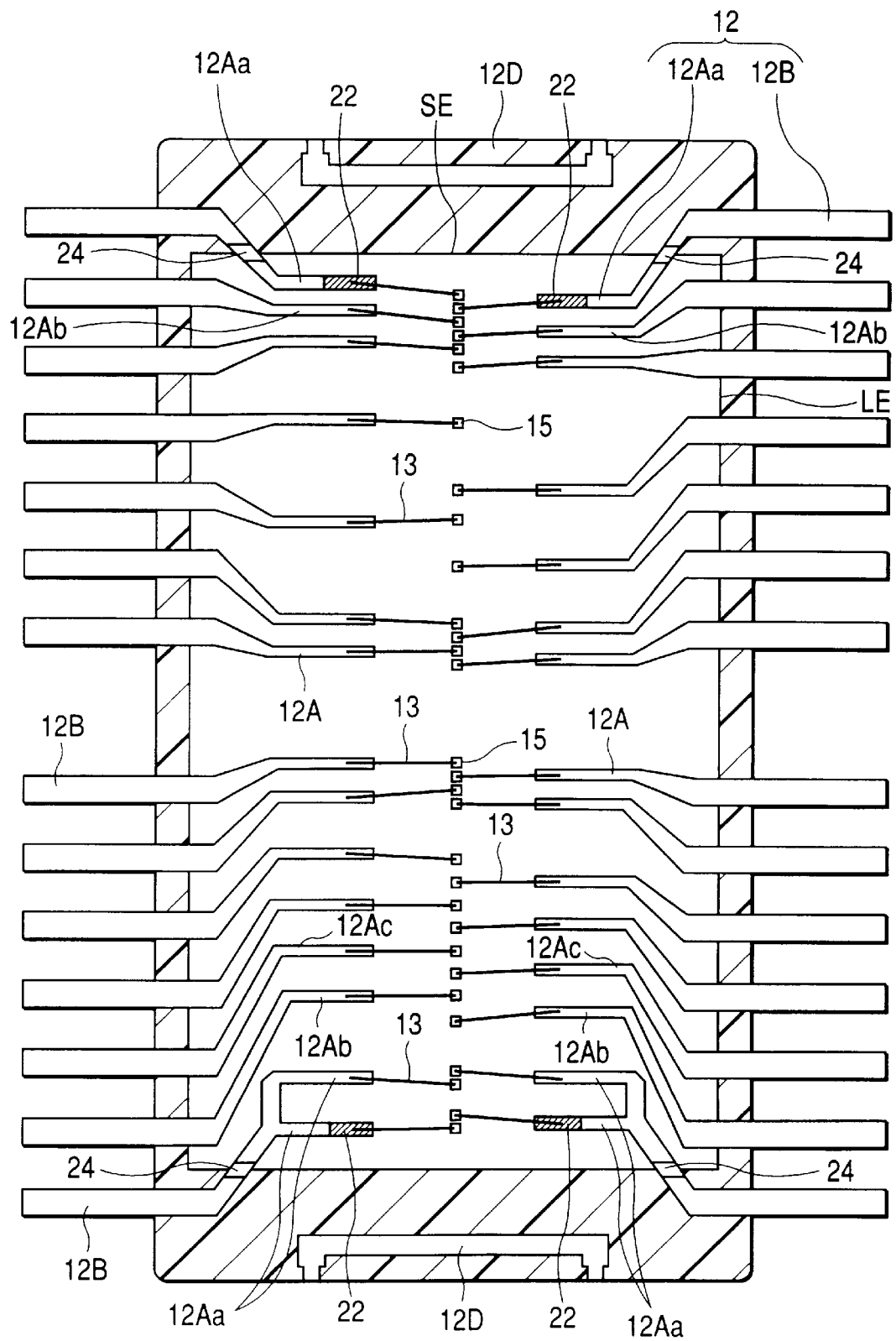
FIG. 21 is a plan view showing a main part of a semiconductor package according to a fifth embodiment of the present invention.

FIG. 21 is a diagram showing a semiconductor device according to another embodiment of the present invention. In this case, each of the four inner lead parts 12A*a* positioned on both ends of the chip 11 has a joining part 22, but does not have a bent part. The semiconductor device of this type is effective when a distortion in the adhesive 21 caused by the concentration of stress by temperature cycling can be ignored. Although the four inner lead parts 12A*a* on the outermost sides have joining parts 22, four inner lead parts 12A*b* on the inner sides of them may have joining parts, respectively.

(embodiment 6)

Figure 22:
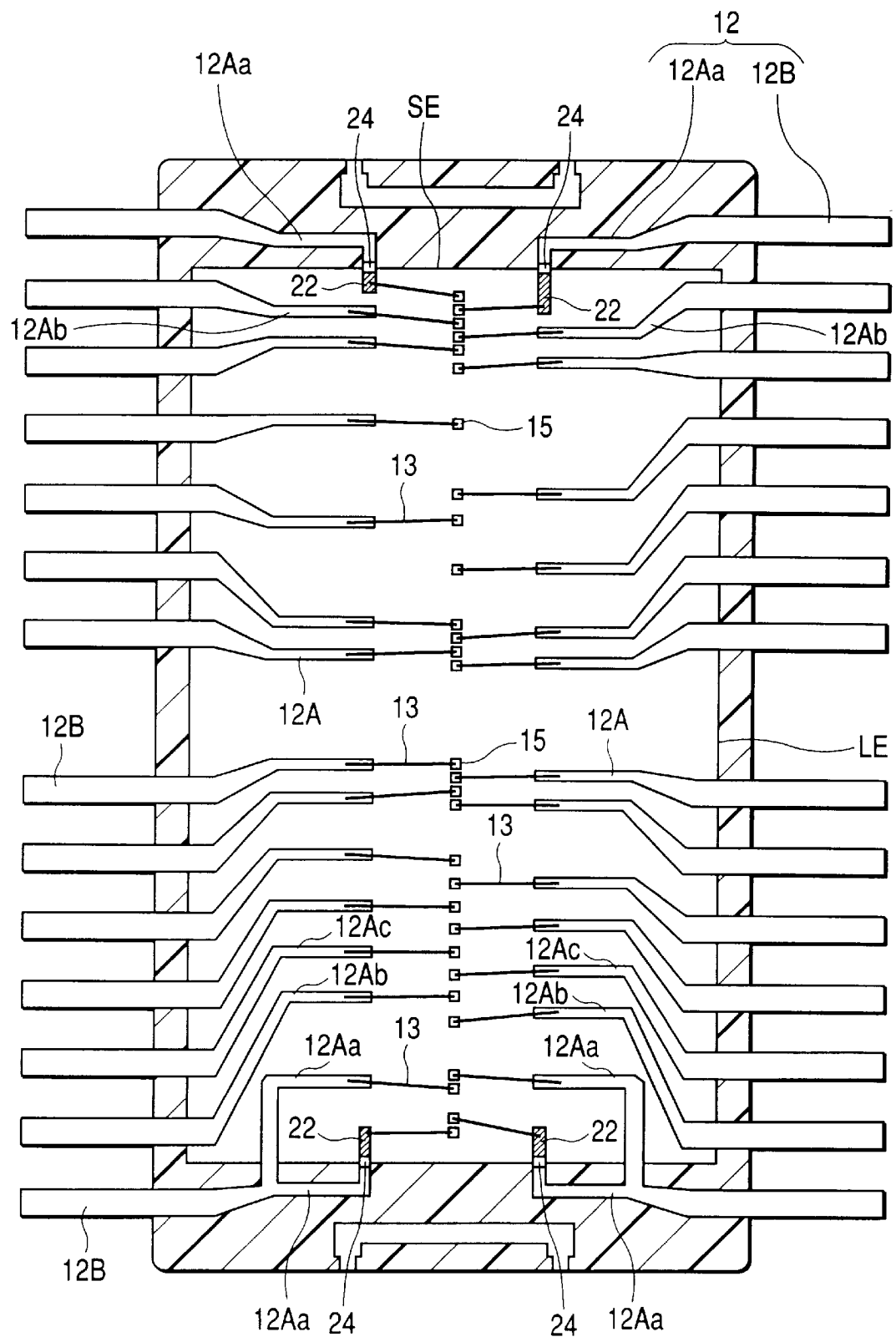
FIG. 22 is a plan view showing a main part of a semiconductor package according to a sixth embodiment of the present invention.

FIG. 22 is a diagram showing a semiconductor device according to still another embodiment of the present invention. Although the joining parts 22 shown in FIG. 21 are orientated in the width direction of the chip 11, the joining parts 22 are oriented in the longitudinal direction and the tips of the inner lead parts 12A*a* are arranged so as to be over the edge SE of the chip 11. In this case, an effect similar to the case shown in FIG. 21 can be obtained.

(embodiment 7)

Figure 23:
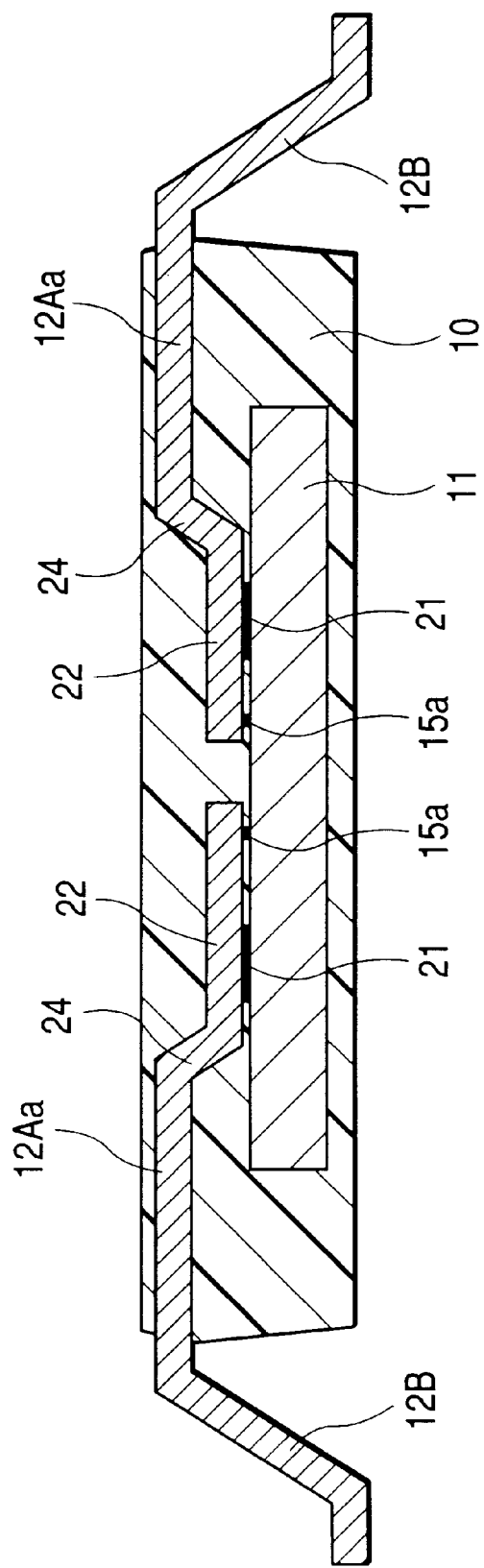
FIG. 23 is a cross section of a main part of a semiconductor package according to a seventh embodiment of the present invention.

FIG. 23 is a diagram showing a semiconductor device forming another embodiment of the present invention. In this case, the inner lead parts 12A*a* of the leads 12 are electrically connected directly to the Au bump electrodes 15*a* formed on the circuit formation face 14 of the chip 11 without using wires. The position of the bump electrode 15*a* and the position at which the adhesive 21 is applied are deviated. The other leads 12A*b* and 12A*c* are connected to the Au bump electrodes and the adhesive 21 is not applied.

(embodiment 8)

Figure 24A:
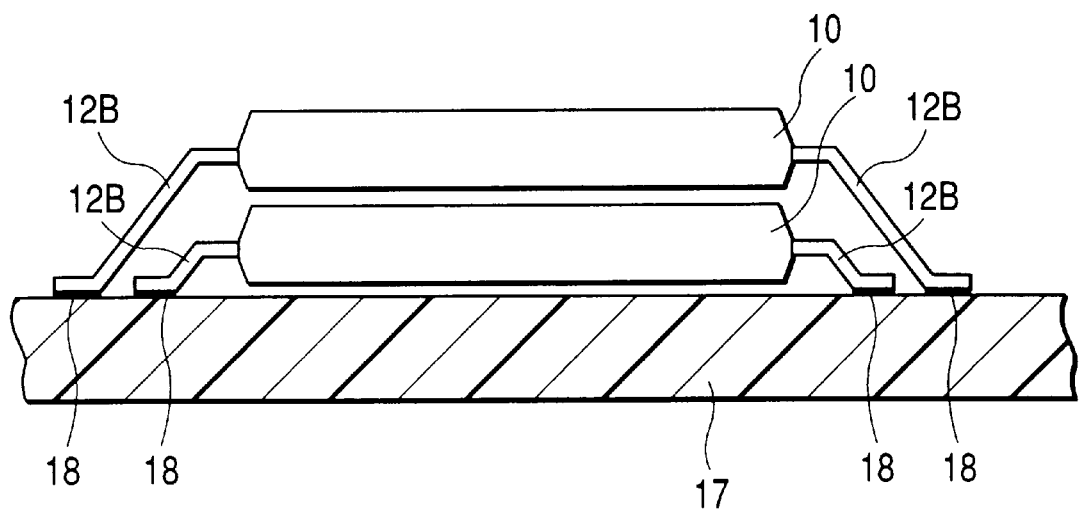
FIGS. 24(A) and 24(B) are cross sections of a semiconductor device having a laminated memory module structure according to an eighth embodiment of the present invention.
Figure 24B:
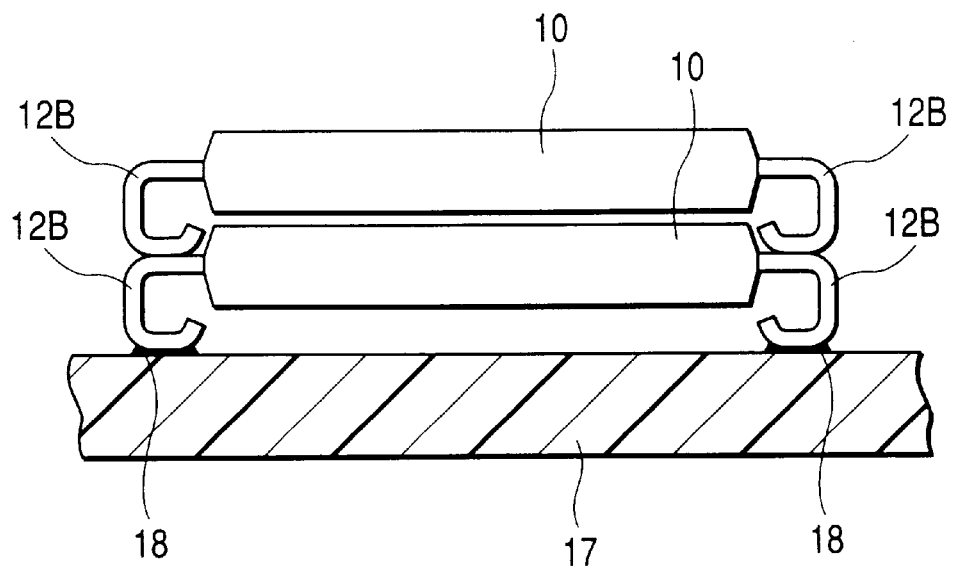

FIGS. 24(A) and 24(B) are diagrams of semiconductor devices according to other embodiments of the present invention. FIG. 24(A) shows a semiconductor device having a laminated type memory module structure obtained by laminating two TSOPs and soldering the outer lead parts 12B to electrodes 18 on a printed wiring board 17.

Each of the TSOPs of FIG. 24(A) is the same as the one shown in FIGS. 2 and 3. The inclined part of the outer lead parts 12B of the upper TSOP is longer than that of the lower TSOP. In order to mount the TSOPs on the printed wiring board 17, solder plating is preliminarily performed on the outer lead parts 12B, solder paste is preliminarily printed on the surface of the electrodes 18, and the outer lead parts 12B are temporarily joined to the electrodes 18 by the adhesion of the solder paste. The temporary attachment may be also performed by melting the surface plating of solder of the outer lead part 12B by preliminary heating after positioning the outer lead part 12B on the electrode 18. By reflowing the solder plating after the temporary attachment, the mounting operation is completed. In case of mounting one TSOP on the printed wiring board 17, a similar procedure is used.

FIG. 24(B) shows a semiconductor device of a laminated type having a memory module structure in which two TSOJ-type semiconductor devices are laminated and are arranged on the printed wiring board 17. The lower TSOJ is mounted by joining the outer leads 12B to the printed wiring board 17 in a manner similar to the case shown in FIG. 24(A). The upper TSOJ is mounted by connecting the outer leads 12B to the outer leads 12B of the lower TSOJ.

Although the invention made by the inventors of the present invention has been specifically described above on the basis of various embodiments, it is to be understood that the present invention is not limited to the foregoing embodiments, but can be variously changed within the scope of the appended claims.

For example, the shape of the outer lead 12B is not limited to the illustrated TSOP and TSOJ types. The present invention can be applied to semiconductor devices of other types, such as a TQFP type, as long as the inner lead parts are arranged on the circuit formation face. In this case, inner leads are joined at four corners of the square chip. The present invention can be applied not only to the package in which the memory LSI is encapsulated, but also to a package in which a microcomputer and a logic LSI are encapsulated and to a laminate type multichip module using such a package. By forming a light reflecting layer, such as aluminum foil on the surface of the encapsulating body 10, also in the case where the encapsulating body 10 is very thinly formed, deterioration in characteristics, such as data retention caused by light, can be prevented.

Effects obtained by representative features among the present embodiments disclosed in this application will be briefly described as follows.

Since the inner lead parts positioned on the outermost sides among the inner lead parts arranged on the circuit formation face of the chip have joining parts and the joining parts are bonded to the chip, the portion in which the adhesive is applied is reduced and the semiconductor device can be promptly manufactured in a short time and the manufacturing efficiency is improved.

Since only the inner lead parts positioned on both ends among the inner lead parts are bonded, the chip is prevented from being deviated from the lead frame upon formation of the resin encapsulating body, so that a high-quality semiconductor device can be obtained while improving the manufacturing efficiency.

Since each of the inner lead parts bonded to the chip has a bent part for absorbing stress at the time of temperature cycling, the breakage of the inner lead parts bonded to the chip can be prevented. Consequently, high-quality semiconductor device having excellent durability can be obtained.

Since stress is prevented from concentrating on the joining part by forming the bent part, the surface protective layer of the circuit formation face is prevented from being peeled off by the stress occurring in the joining parts and the occurrence of a crack in the resin encapsulating body due to the peeling can be prevented, so that a semiconductor device having excellent durability can be obtained.

A gap is formed between a part, corresponding to the outer peripheral edge of the chip, of the inner lead bonded to the chip with the adhesive and the circuit formation surface. The gap is larger than the height of any remnant that may occur at the edge part. Even when the inner leads are bonded with the adhesive, the contact between the remnants and the inner leads is, therefore, avoided.

What is claimed is:

1. A semiconductor device, comprising:

a semiconductor chip having a plurality of semiconductor elements and a plurality of bonding pads on its main face;

a first lead and a second lead each having an inner lead portion and an outer lead portion, a part of the inner lead portion of each of said first and second leads being arranged on the main face of said semiconductor chip;

wires for connecting the inner lead portions of said first and second leads and said plurality of corresponding bonding pads; and a resin encapsulating body for encapsulating said semiconductor chip, the inner lead portions of said first and second leads, and said wires, wherein said part of said inner lead portion of said first lead is joined on the main face of said semiconductor chip with an adhesive interposed therebetween, said second lead is not joined on the main face of said semiconductor chip with an adhesive, and wherein said adhesive joining said part of said inner lead portion of said first lead with said main surface of said semiconductor chip is an adhesive without using an interposed insulating film.

2. A semiconductor device according to claim 1, wherein the inner lead portion of said first lead has a first part joined to the main face of said semiconductor chip with said adhesive and a second part arranged above the main face of said semiconductor chip at a position higher then said first portion, and the inner lead portion of said second lead is arranged at a position at almost the same height as that of the second part of the inner lead portion of said first lead.

3. A semiconductor device, comprising:

a rectangular semiconductor chip having a plurality of semiconductor elements and a plurality of bonding pads on its main face, said plurality of bonding pads being arranged in the direction of the long sides of said semiconductor chip;

a plurality of leads each having an inner lead portion and an outer lead portion, a part of the inner lead portion of each of said plurality of leads being arranged on the main face of said semiconductor chip and said plurality of leads being arranged at predetermined intervals in said long-side direction;

wires for connecting the inner lead portions of said plurality of leads and said plurality of corresponding bonding pads; and a resin encapsulating body for encapsulating said semiconductor chip, the inner lead portions of said plurality of leads, and said wires, wherein a pair of first leads arranged on the outermost sides on the main face of said semiconductor chip among said plurality of leads are joined to the main face of said semiconductor chip with an adhesive interposed therebetween, second leads arranged between said pair of first leads among said plurality of leads are not joined to the main face of said semiconductor chip with an adhesive, and wherein said adhesive joining each of said inner lead portions of said pair of first leads with said main surface of said semiconductor chip is an adhesive without using an interposed insulating film.

4. A semiconductor device according to claim 3, wherein the inner lead portion of said first lead has a first part joined to the main face of said semiconductor chip with said adhesive and a second part arranged above the main face of said semiconductor chip at a position higher than said first portion, and the inner lead portion of said second lead is arranged at almost the same height as that of the second part of the inner lead portion of said first lead.

5. A semiconductor device according to claim 3, wherein there are provided four of said first leads which are arranged near the four corners of said semiconductor chip.

6. A semiconductor device, comprising:

a semiconductor chip having a plurality of semiconductor elements and a plurality of bonding pads on a main surface thereof;

a first lead having an inner lead portion and an outer lead portion which is continuous with said inner lead portion, a part of said inner lead portion of said first lead being disposed on said main surface of said semiconductor chip;

a second lead having an inner lead portion and an outer lead portion which is continuous with said inner lead portion, a part of said inner lead portion of said second lead being disposed on said main surface of said semiconductor chip;

bonding wires connecting said parts of inner leads of said first and second leads with corresponding bonding pads of said plurality of bonding pads; and a resin body sealing said semiconductor chip, said inner lead portions of said first and second leads and said bonding wires, wherein said part of said inner lead portion of said first lead is adhered to said main surface of said semiconductor chip by an adhesive without using an interposed insulating film, wherein said part of said inner lead portion of said second lead is space from said main surface of said semiconductor chip, and wherein said parts of said inner lead portions of said first and second leads do not overlap in a plane view.

7. A semiconductor device according to claim 6, wherein a part of said resin body is in a space between said part of said inner lead portion of said second lead and said main surface of said semiconductor chip.

8. A semiconductor device according to claim 6, wherein said adhesive is applied by a dispenser to a surface of said part of said inner lead portion of said first lead.

9. A semiconductor device, comprising:

a semiconductor chip having a plurality of semiconductor elements and a plurality of bonding pads on a main surface thereof;

a first lead having an inner lead portion and an outer lead portion which is continuous with said inner lead portion, a part of said inner lead portion of said first lead being disposed on said main surface of said semiconductor chip;

a second lead having an inner lead portion and an outer lead portion which is continuous with said inner lead portion, a part of said inner lead portion of said second lead being disposed on said main surface of said semiconductor chip;

bonding wires connecting said parts of inner leads of said first and second leads with the corresponding bonding pads of said plurality of bonding pads; and a resin body sealing said semiconductor chip, said inner lead portions of said first and second leads and said bonding wires, wherein said part of said inner lead portion of said first lead is disposed at the closer position with respect to said main surface of said semiconductor chip than said part of said inner portion of said second lead in a thickness direction of said semiconductor chip, wherein said part of said inner lead portion of said first lead is adhered to said main surface of said semiconductor chip by an adhesive without using an interposed insulating film.

10. A semiconductor device according to claim 9, wherein a part of said resin body is in a space between said part of said inner lead portion of said second and said main surface of said semiconductor chip.

11. A semiconductor device according to claim 9, wherein said adhesive is applied by a dispenser to a surface of said part of said inner lead portion of said first lead.

12. A semiconductor device according to claim 9, wherein said part of said first lead has a first portion, a second portion and a stepped portion between said first and second portions, wherein said second portion is spaced from said main surface of said semiconductor chip than said first portion in the thickness direction of said semiconductor chip, and wherein said first portion is adhered to said main surface of said semiconductor chip by said adhesive.

13. A semiconductor device according to claim 12, wherein said second portion of said part of said first lead is positioned at substantially the same height as said part of said second lead in the thickness direction of said semiconductor chip.

* * * * *